US011381045B2

(12) United States Patent
Hung

(10) Patent No.: US 11,381,045 B2
(45) Date of Patent: Jul. 5, 2022

(54) FAN CONNECTOR

(71) Applicant: Dongguan Luxshare Technologies Co., Ltd, Dongguan (CN)

(72) Inventor: Yung-Chih Hung, Taipei (TW)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 17/152,144

(22) Filed: Jan. 19, 2021

(65) Prior Publication Data

US 2021/0226391 A1    Jul. 22, 2021

Related U.S. Application Data

(63) Continuation-in-part of application No. 16/881,677, filed on May 22, 2020, now Pat. No. 11,133,612.

(30) Foreign Application Priority Data

Jan. 21, 2020   (TW) ................................. 109102321
Oct. 23, 2020   (TW) ................................. 109136976

(51) Int. Cl.
*H01R 12/72*     (2011.01)
*H01R 24/60*     (2011.01)
(Continued)

(52) U.S. Cl.
CPC ......... *H01R 24/60* (2013.01); *H01R 13/2407* (2013.01); *H01R 13/50* (2013.01); *H01R 13/6581* (2013.01)

(58) Field of Classification Search
CPC ...... H01R 12/72; H01R 12/712; H01R 12/71; H01R 12/70; H01R 13/11; H01R 13/10;
(Continued)

(56) References Cited

U.S. PATENT DOCUMENTS 5,923,529 A * 7/1999 Mimachi ............... G06F 13/409
                                                  361/785
6,884,120 B1 * 4/2005 Haba ...................... H01R 12/88
                                                  439/630

(Continued)

FOREIGN PATENT DOCUMENTS

CN      206471630 U    9/2017
CN      208272202 U    12/2018
(Continued)

*Primary Examiner* — Harshad C Patel
(74) *Attorney, Agent, or Firm* — Birch, Stewart, Kolasch & Birch, LLP

(57) ABSTRACT

A fan connector comprises a connector body, a plurality of chip terminals, a plurality of wiring terminals, and a chip circuit board. The connector body comprises an electrical connection slot, a chip slot, and a wiring slot. The plurality of chip terminals and the plurality of wiring terminals are disposed on a sidewall of the electrical connection slot. The plurality of chip terminals corresponds to the plurality of wiring terminals, respectively. The chip circuit board comprises a chip, a circuit board, and a plurality of conductive pads. The chip circuit board is inserted into the chip slot. The plurality of conductive pads is in contact with the corresponding chip terminals. One end of the connector body is connected to a fan, in which a wire passes through the wiring slot and connects to the plurality of wiring terminals. An external plug is possible to insert into the electrical connection slot.

19 Claims, 26 Drawing Sheets

(51) Int. Cl.
*H01R 13/24* (2006.01)
*H01R 13/6581* (2011.01)
*H01R 13/50* (2006.01)

(58) Field of Classification Search
CPC ...... H01R 13/02; H01R 13/62; H01R 13/648;
H01R 13/2407; H01R 13/24; H01R
13/22; H01R 13/15; H01R 13/50; H01R
13/46; H01R 13/6581; H01R 24/60;
G02B 6/0008
USPC ........................................................ 439/345
See application file for complete search history.

(56) References Cited

U.S. PATENT DOCUMENTS

| | | | | |
|---|---|---|---|---|
| 7,699,624 | B2 * | 4/2010 | Muramatsu | G01D 11/28 |
| | | | | 439/541.5 |
| 8,591,265 | B2 * | 11/2013 | Huang | H01R 13/6597 |
| | | | | 439/660 |
| 8,864,420 | B2 * | 10/2014 | Foo | B63B 27/34 |
| | | | | 414/137.1 |
| 9,054,550 | B2 * | 6/2015 | Akai | B60L 3/04 |
| 10,193,211 | B2 * | 1/2019 | Finn | G06K 19/07773 |
| 10,777,877 | B2 * | 9/2020 | Su | H01Q 1/2291 |
| 11,114,785 | B2 * | 9/2021 | Hung | H01R 13/11 |
| 11,133,612 | B2 * | 9/2021 | Hung | G02B 6/0008 |
| 2019/0114526 | A1 * | 4/2019 | Finn | H01Q 21/29 |

FOREIGN PATENT DOCUMENTS

| | | |
|---|---|---|
| TW | M309789 U | 4/2007 |
| TW | M539714 U | 4/2017 |
| TW | M559016 U | 4/2018 |
| TW | I675515 B | 10/2019 |

\* cited by examiner

FAN CONNECTOR

CROSS-REFERENCE TO RELATED APPLICATION

This application is a continuation in part of U.S. patent application Ser. No. 16/881,677, filed May 22, 2020, which claims the benefit of U.S. claims the priority benefit of Taiwanese Patent Application Serial Number TW109102321, filed on Jan. 21, 2020, and Taiwanese Patent Application Serial Number TW109136976, filed on Oct. 23, 2020 each of which is incorporated by reference herein in its entirety.

BACKGROUND

Technical Field

The present disclosure relates to the technical field of a connector, particularly to a fan connector.

Related Art

In general, a circuit board is often installed in conventional fan connectors for servers before installing a chip unless performing data recording. When a chip is under installation, the pins of the chip would be connected to the internal circuit wiring of a fan connector. However, it is technically difficult to manually install a chip into a fan connector due to its tiny size. It is also easy to cause poor contact between the chip and the circuit due to unexpected loosening of the installation. Besides, as the resilient contacting between the pins of the chip and the circuit wiring, the chip is prone to resonance during vibration tests of the fan connector, which reduces the overall reliability.

SUMMARY

The embodiments of the present disclosure provide a fan connector to solve the problem of poor contact and low reliability when a chip is hardly installed in a fan connector by hand, in which the chip and the circuit are separately provided.

The present disclosure provides a fan connector, comprising a connector body, a plurality of chip terminals, a plurality of wiring terminals, and a chip circuit board. The connector body comprises an electrical connection slot, a chip slot, and a wiring slot. The electrical connection slot is disposed at one end of the connector body. The chip slot and the wiring slot are disposed at the other end of the connector body. The electrical connection slot communicates with the chip slot and the wiring slot, respectively. The plurality of chip terminals is disposed on a sidewall of the electrical connection slot. One end of each of the plurality of chip terminals away from the electrical connection slot is disposed in the chip slot. The plurality of wiring terminals is disposed on the sidewall of the electrical connection slot. The plurality of wiring terminals corresponds to the plurality of chip terminals. One end of each of the plurality of wiring terminals away from the electrical connection slot is disposed in the connection slot. The chip circuit board comprising a circuit board, a chip, and a plurality of conductive pads. The chip and the plurality of conductive pads are disposed on the circuit board. The chip comprises a plurality of pins respectively connected to the corresponding plurality of conductive pads. The chip is inserted into the chip slot. The plurality of conductive pads is in contact with the corresponding plurality of chip terminals, respectively. The other end of the connector body is connected to the fan. A wire of the fan passes through the wiring slot and connects to the plurality of wiring terminals. An external plug is possible to insert into the electrical connection slot. The plurality of chip terminals and the plurality of connection terminals are in contact with a plurality of conductive terminals of the external plug, respectively.

In the embodiments of the present disclosure, the chip is installed onto the circuit board followed by inserting the circuit board with the chip into the connector body. In this way, the insertion of the chip becomes easy, and it also ensures that the chip terminals of the fan connector could have a stable connection with the conductive pads of the chip circuit board. Thus, the reliability of the fan connector could be effectively improved.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
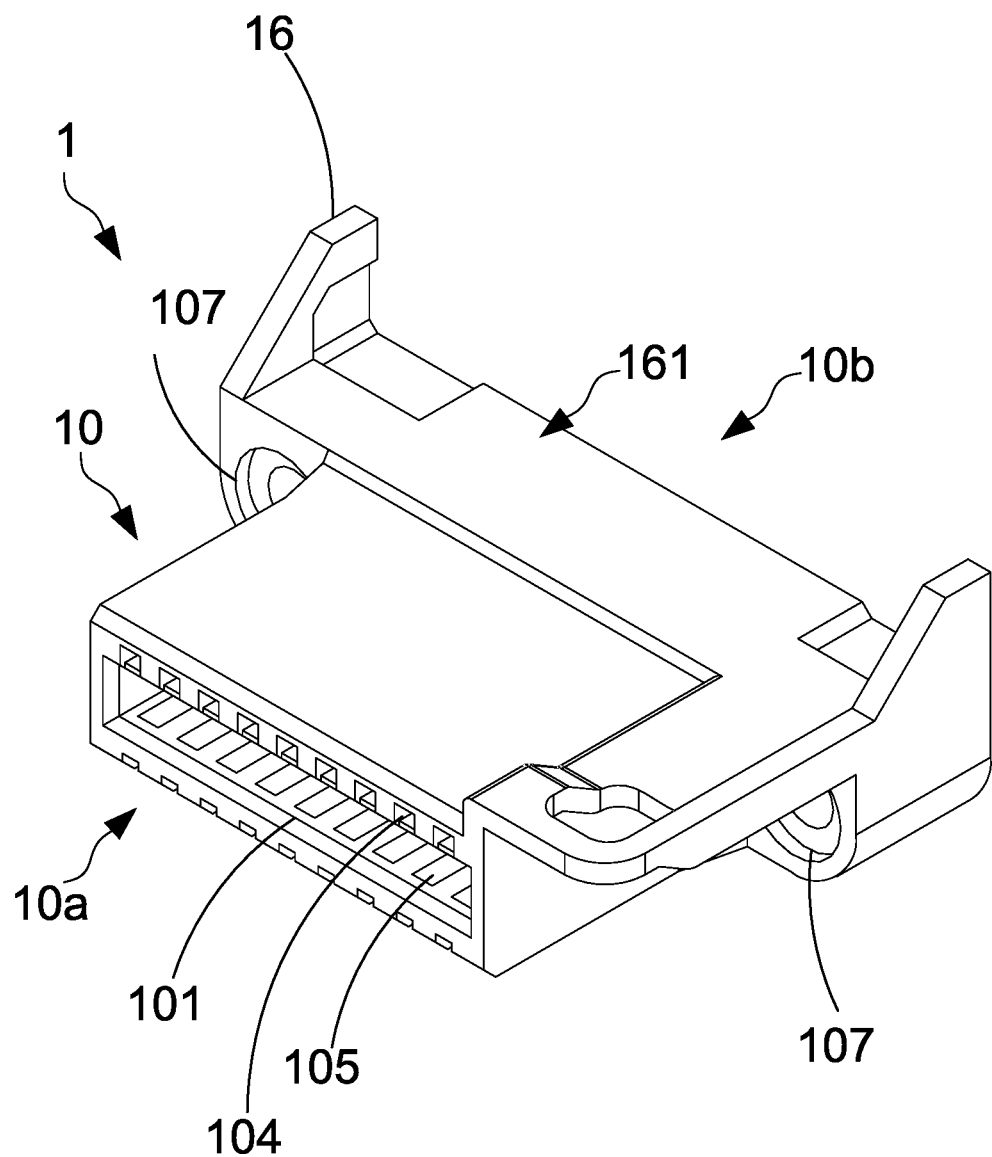
FIG. 1 is a perspective view of a fan connector of the first embodiment of the present disclosure.
Figure 2:
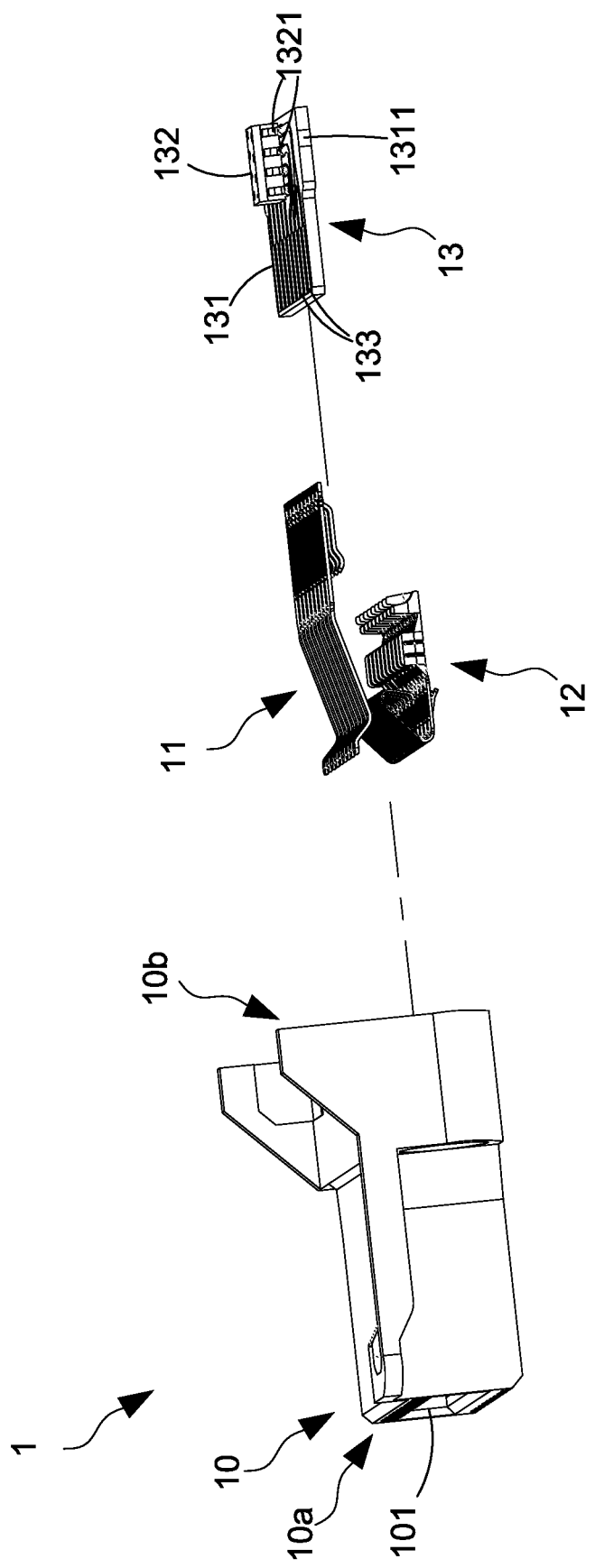
FIG. 2 is an exploded view of the fan connector of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

Figure 5:
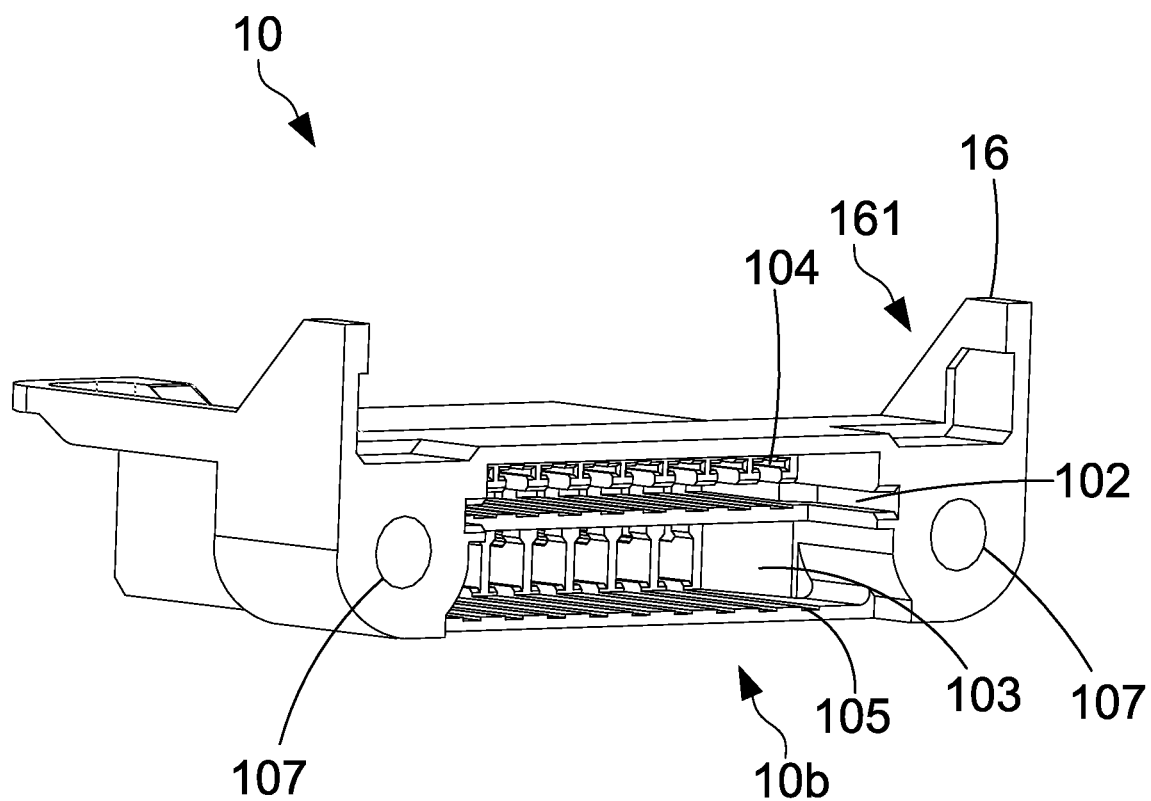
FIG. 5 is a perspective view of a connector body of the first embodiment of the present disclosure.

FIG. 1 to FIG. 4 are perspective view, exploded view, and cross-sectional views of a connector of the first embodiment of the present disclosure. As shown in the figures, the fan connector 1 of the present embodiment comprises a connector body 10, a plurality of signal terminals 11, a plurality of wiring terminals 12, and a chip circuit board 13. FIG. 5 is a perspective view of a connector body of the first embodiment of the present disclosure. As shown in the figure, the connector body 10 comprises an electrical connection slot 101, a chip slot 102, and a wiring slot 103. The connector body 10 comprises a first end 10a and a second end 10b. The electrical connection slot 101 is disposed at the first end 10a of the connector body 10. The chip slot 102 and the wiring slot 103 are disposed at the second end 10b of the connector body 10. The chip slot 102 is disposed above the wiring slot 103. The electrical connection slot 101 respectively communicates with the chip slot 102 and the wiring slot 103.

The plurality of signal terminals 11 and the plurality of wiring terminals 12 are respectively disposed on two opposite sidewalls of the electrical connection slot 101. In this embodiment, the plurality of signal terminals 11 are disposed on an upper sidewall of the electrical connection slot 101, and the plurality of wiring terminals 12 are disposed on a lower sidewall of the electrical connection slot 101. The plurality of signal terminals 11 corresponds to the plurality of wiring terminals 12. One end of each of the plurality of signal terminals 11 away from the electrical connection slot 101 is disposed in the chip slot 102. One end of each of the plurality of wiring terminals 12 away from the electrical connection slot 101 is disposed in the wiring slot 103.

The circuit board 13 comprises a circuit board body 131, a chip 132, and a plurality of conductive pads 133. The chip 132 and the plurality of conductive pads 133 are disposed on the circuit board body 131. In this embodiment, the chip 132 is soldered on the circuit board 131. The plurality of conductive pads 133 are disposed on one end of the circuit board body 131 at intervals and are aligned in a row. The chip 132 comprises a plurality of pins 1321 connected to the corresponding plurality of conductive pads 133, respectively. The chip circuit board 13 is inserted into the chip slot 102. The plurality of conductive pads 133 are close to the electrical connection slot 101 and are in contact with the corresponding signal terminals 11, respectively. In one embodiment, an interference protrusion 1311 is provided on a side of the circuit board 131. When the chip circuit board 13 is inserted into the chip slot 102, the interference protrusion 1311 of the circuit board 131 is interferingly connected to a sidewall of the circuit board slot 102. In this embodiment, the number of the interference protrusions 1311 is two. The two interference protrusions 1311 are opposite to each other.

Figure 6:
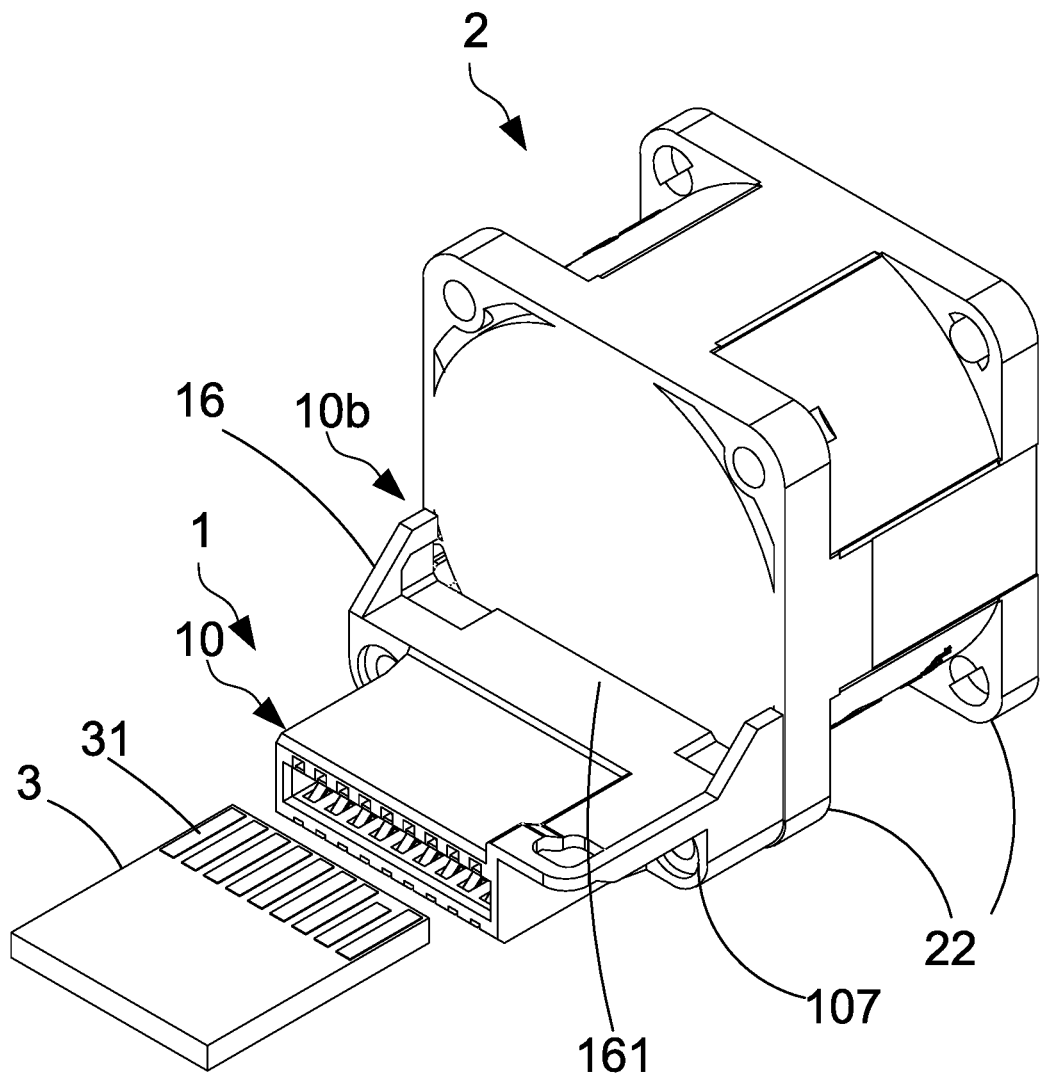
FIG. 6 is a use state diagram of the fan connector of the first embodiment of the present disclosure.

FIG. 6 is a use state diagram of the fan connector of the first embodiment of the present disclosure. As shown in the figure, the second end 10b of the connector body 10 is connected to the fan 2 and the wire of the fan 2 passes through the wiring slot 103 to connect with the plurality of wiring terminals 12 when the fan connector 1 is in use. An external plug 3 comprising a plurality of conductive terminals 31 could be inserted into the electrical connection slot 101. The external plug 3 could be a circuit board or an electrical connector. When the external plug 3 is inserted into the electrical connection slot 101, the plurality of signal terminals 11 and the plurality of wiring terminals 12 are in contact with the plurality of conductive terminals 31 of the plug 3, respectively.

The chip 132 of the chip circuit board 13 of the fan connector 1 of this embodiment is directly soldered to the circuit board 131. When the fan 1 of this embodiment is in use, the chip circuit board 13 is directly inserted into the chip slot 102 of the connector body 10. In this way, the circuit board 13 can be easily inserted into the connector body 10, and the plurality of conductive pads 133 of the chip circuit board 13 disposed in the connector body 10 can be stably connected to the corresponding chip signal terminals 11. Therefore, the reliability of the fan connector 1 can be effectively improved. The chip 132 receives signals transmitted from the fan 2 and interprets the signals.

The details of the connector body 10, the signal terminal 11, and the wiring terminal 12 would be described in below. The connector body 10 further comprises a plurality of chip terminal slots 104 and a plurality of wiring terminal slots 105. The plurality of chip terminal slots 104 is disposed on the upper sidewall of the electrical connection slot 101 at intervals. Each of the plurality of chip terminal slots 104 extends toward and communicates with the chip slot 102. The plurality of wiring terminal slots 105 is disposed on the lower sidewall of the electrical connection slot 101 at intervals. Each of the plurality of wiring terminal slots 105 extends toward and communicates with the wiring slot 103. Each of the plurality of chip terminal slots 104 passes through the first end 10a of the connector body 10, and each of the plurality of wiring terminal slots 105 passes through the second end 10b of the connector body 10.

The plurality of chip terminals 11 is respectively disposed in the corresponding chip terminal slots 104. The plurality of wiring terminals 12 is respectively disposed in the corresponding wiring terminal slots 105. Thus, the plurality of chip terminals 11 and the plurality of wiring terminals 12 are disposed in the connector body 10 at intervals.

Each of the plurality of chip terminals 11 comprises a first contacting part 111 and a second contacting part 112. When the plurality of chip terminals 11 passes through the chip terminal slot 104 from the second end 10b of the connector body 10, the plurality of signal terminals 11 moves along with the chip terminal slot 104 to the electrical connection slot 101. Then the first contacting part 111 would be disposed in the electrical connection slot 101, and the second contacting part 112 would be disposed in the chip slot 102. When the chip circuit board 13 is inserted into the chip slot 102, the second contacting part 112 of the plurality of chip terminals 11 would respectively contact with the plurality of conductive pads 133 of the circuit board 13. When the external plug 3 is inserted into the electrical connection slot 101, the plurality of first contacting parts 111 of the plurality of chip terminals 11 would be in contact with the plurality of conductive terminals 31 of the external plug 3, respectively.

Figure 7:
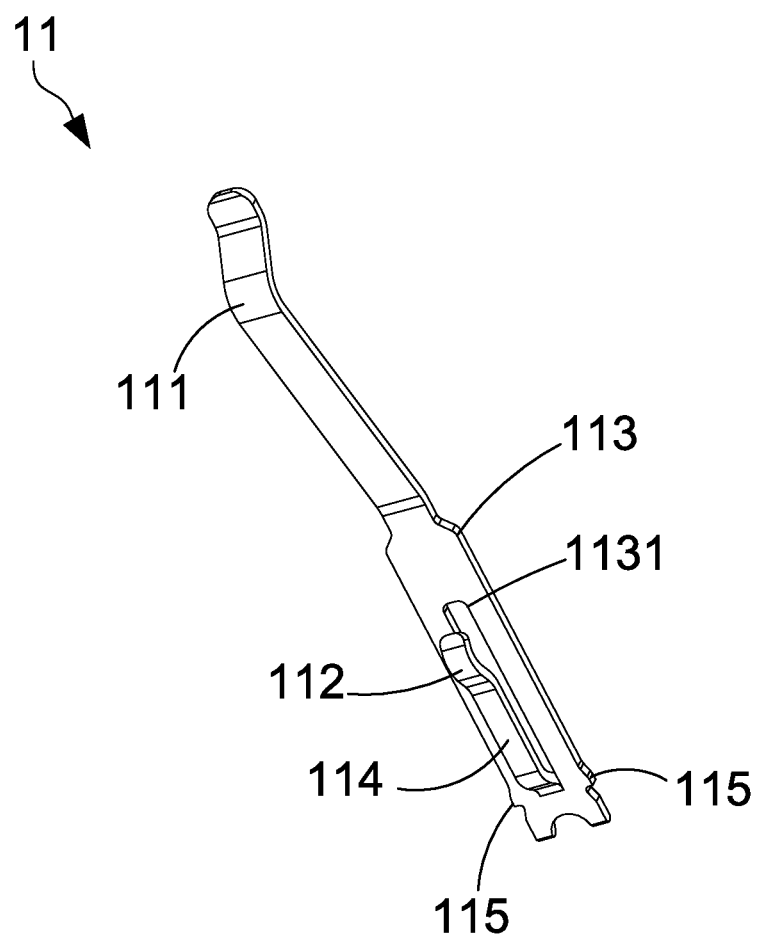
FIG. 7 is a perspective view of a chip terminal of the first embodiment of the present disclosure.

FIG. 7 is a perspective view of a chip terminal of the first embodiment of the present disclosure. As shown in the figure, each of the plurality of chip terminals 11 comprises a first metal spring plate 113 and a second metal spring plate 114. One end of the second metal spring plate 114 is connected to the first metal spring plate 113. The other end of the second metal spring plate 114 is away from the first metal spring plate 113, that is, there is a gap between the second metal spring plate 114 and the first metal spring plate 113. One end of the first metal spring plate 113 away from the second metal spring plate 114 is bent. The first metal spring plate 113 is bent to form a protrusion, which is the first contacting part 111. One end of the second metal spring plate 114 that is not connected to the first metal spring plate 113 is bent to form a protrusion, which is the second contacting part 112. When the circuit board 13 is inserted into the chip slot 102, the chip circuit board 13 compresses the second metal spring plate 114 to move toward the first metal spring plate 113, having the circuit board 13 to be movable in the chip slot 102. When the chip circuit board 13 is fully inserted into the chip slot 102, the second metal spring plate 114 is compressed to generate an elastic force pressing the second contacting part 112 to firmly contact the corresponding conductive pads 133.

In one embodiment, the first metal spring plate 113 of this embodiment further comprises a first retaining hole 1131 corresponding to the second metal spring plate 114. The second metal spring plate 114 is allowed to enter the first retaining hole 1131 when the second metal spring plate 114 moves toward the first metal spring plate 113. In this way, it is ensured that the circuit board 13 could enter the chip slot 102 without obstruction. In one embodiment, the two sides of the plurality of chip terminals 11 in this embodiment further comprise a terminal interference part 115, respectively. When the chip circuit board 13 is completely inserted into the chip slot 102, the two terminal interference parts 115 interfere with two opposite sidewalls of the chip terminal slot 104 to secure the plurality of chip terminals 11 in the corresponding chip terminal slot 104, preventing the plurality of chip terminals 11 from disengaging from the corresponding chip terminal slot 104.

Each of the plurality of wiring terminals 12 comprises a contacting part 121 and a connecting part 122 connected to a wire of the fan 2. When the plurality of wiring terminals 12 is inserted into the corresponding wiring terminal slot 105, the contacting part 121 of each of the plurality of wiring terminals 12 is diposed in the electrical connection slot 101, the wire connected to the connecting part 122 is disposed in the corresponding wiring terminal slot 105, and the wire of the fan 2 is integrated in the wiring slot 103. When the external plug 3 is inserted into the electrical connection slot 101, the plurality of contacting parts 121 of the plurality of wiring terminals 12 is in contact with the plurality of conductive terminals 31 of the external plug 3, respectively.

Figure 8:
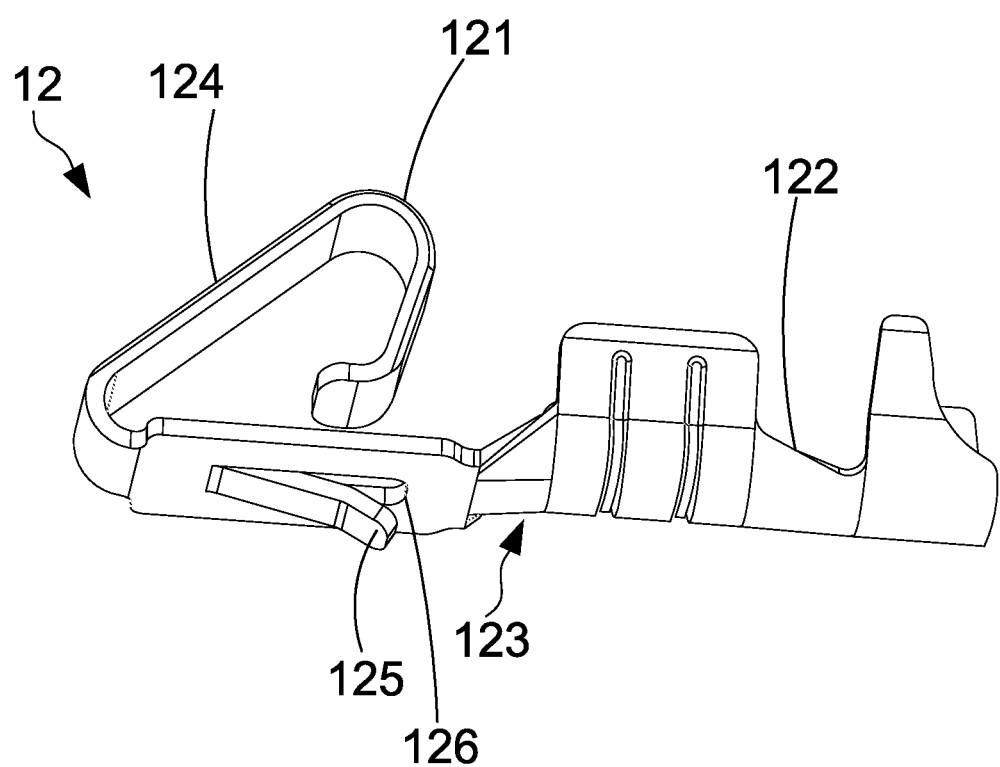
FIG. 8 is a perspective view of a wiring terminal of the first embodiment of the present disclosure.

FIG. 8 is a perspective view of a wiring terminal of the first embodiment of the present disclosure. As shown in the figure, the wiring terminal 12 of this embodiment comprises a terminal body 123 and a bent spring plate 124. One end of the bent spring plate 124 is connected to the terminal body 123. The other end of the bent spring plate 124 is disposed above the terminal body 123. The protrusion of the bent spring plate 124 is the contacting part 121. A gap exists between the bent spring plate 124 and the terminal body 123, making the bent spring plate 124 movable relative to the terminal body 123. When the external plug 3 is inserted into the electrical connection slot 101, the external plug 3 could compress the bent spring plate 124 to move toward the terminal body 123, making the external plug 3 to be movable in the electrical connection slot 101. When the external plug 3 is fully inserted into the electrical connection slot 101, the elastic force generated by the compressed bent spring plate 124 presses the contacting part 121 to firmly contact the conductive terminals 31 of the external plug 3.

In one embodiment, the wiring terminal 12 of this embodiment further comprises a spring buckle 125 extending toward the second end 10b of the connector body 10. The wiring terminal slot 105 further comprises a buckling part 1051, of which the surface facing the first end 10a of the connector body 10 is an abutment surface 10511 perpendicular to a lower sidewall of the electrical connection slot 101. When the wiring terminal 12 is inserted into the corresponding wiring terminal slot 105, the abutment surface 10511 of the buckling part 1051 could block one end of the spring buckle 125 facing toward the second end 10b of the connector body 10 to prevent the wiring terminal 12 from detaching from the connector body 10. In one embodiment, one end of the spring buckle 125 facing the second end 10*b* of the connector body 10 is a movable end, that is, the spring buckle 125 is compressible. In this way, the wiring terminal 12 is inserted between the wiring terminal slot 105 and the buckling part 1051. Meanwhile, the spring buckle 125 is compressed. When the spring buckle 125 of the wiring terminal 12 moves to the buckling part 1051, the spring buckle 125 is ejected toward the lower sidewall of the electrical connection slot 101 and abuts against the abutment surface 10511 of the buckling part 1051. The wiring terminal 12 of this embodiment further comprises a second retaining hole 126 corresponding to the spring buckle 125 to accommodate the compressed spring buckle 125. In this way, the wiring terminal 12 is movable in the corresponding wiring terminal slot 105.

In one embodiment, the fan connector 1 further comprises a deflector 16 disposed at the second end 10*b* of the connector body 10. The deflector 16 comprises a deflecting part 161. When the fan 2 is disposed on the second end 10*b* of the connector body 10, the deflector 16 is disposed on the airflow path of the fan 2. That is, the deflecting part 161 corresponds to an air outlet 21 of the fan 2 and collects the airflow from the fan 2. The deflector 16 is integrally formed with the connector body 10 to one piece, and the bottom surface of the deflecting part 161 is flat.

In one embodiment, the connector body 10 further comprises two locking parts 107 disposed on two sides of the connector body 10. The two locking parts 107 are also disposed on the second end 10*b* of the connector body 10. The fan 2 comprises two securing parts 22 corresponding to the two locking parts 107. The securing part 22 is secured to the locking part 107 by a locking element.

Figure 9:
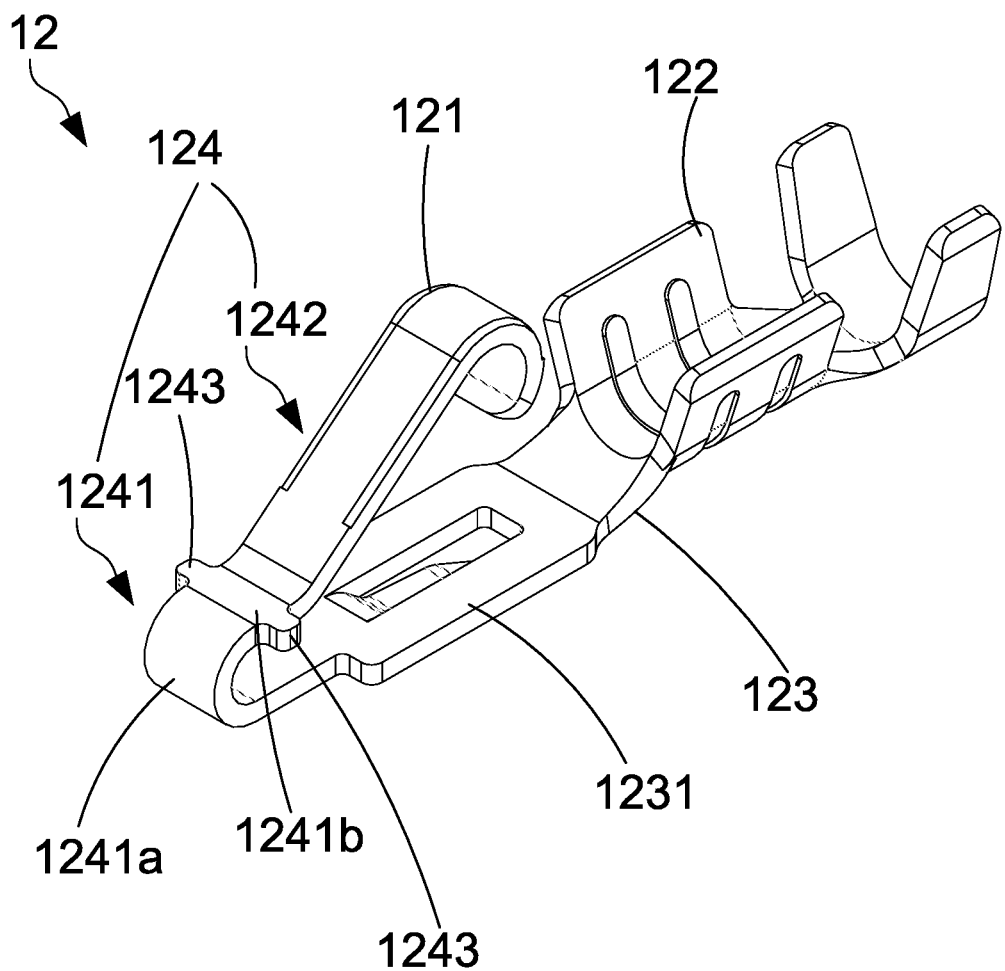
FIG. 9 is a perspective view of a wiring terminal of the second embodiment of the present disclosure.

FIG. 9 is a perspective view of a wiring terminal of the second embodiment of the present disclosure. As shown in the figure, the bent spring plate 124 of this embodiment comprises a connecting end part 1241 and a contacting end part1242. One end of the connecting end part 1241 is connected with the terminal body 123, while the other end is connected with the contacting end part 1242. The connecting end part 1241 comprises a bent section 1241*a* and a flat section 1241*b*. The bent section 1241*a* is connected with the terminal body 123, and the flat section 1241*b* is connected with the contacting end part 1242 and is disposed above the terminal body 123. The flat section 1241*b* is parallel to a part of the terminal body 123. The contacting end part 1242 is inclined relative to the flat section 1241*b*. Two sides of the flat section 1241*b* are respectively provided with a first limiting bump 1243. Two sides of the terminal body 123 of the wiring terminal 12 are respectively provided with a second limiting bump 1231. The two second limiting bumps 1231 are closer than the connecting part 122 to the bent spring plate 124. The two second limiting bumps 1231 are disposed on two sides of the spring buckle 125. In this embodiment, the two first limiting bumps 1243 are closer than the two second limiting bumps 1231 to the bent section 1241*a*.

Figure 10:
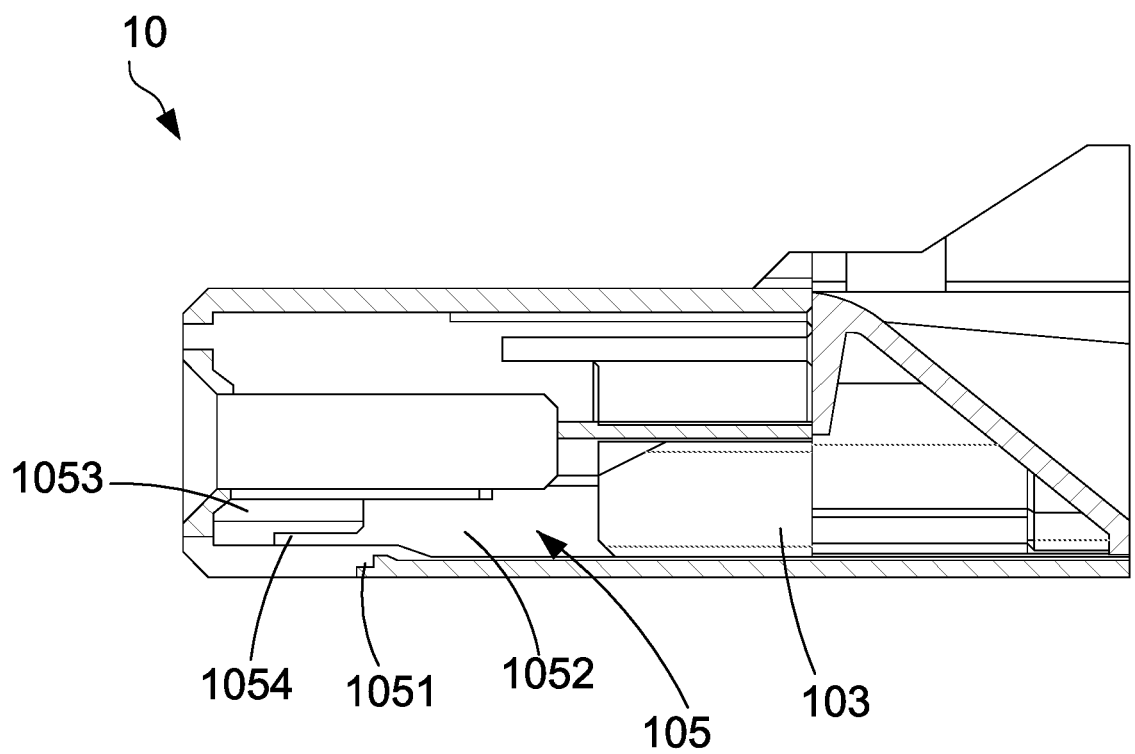
FIG. 10 is a cross-sectional view of a connector body of the second embodiment of the present disclosure.

FIG. 10 is a cross-sectional view of a connector body of the second embodiment of the present disclosure. As shown in the figure, the two opposite sidewalls of the wiring terminal slot 105 of the connector body 10 are respectively provided with a guiding groove 1052, a first limiting groove 1053, and a second limiting groove 1054. The first limiting groove 1053 and the second limiting groove 1054 are respectively disposed in an upper and lower arrangement. The guiding groove 1052 is disposed at one ends of the first limiting groove 1053 and the second limiting groove 1054. The first limiting groove 1053 and the second limiting groove 1054 are farther than the guiding groove 1052 from the wiring slot 103, and are communicating with the guiding groove 1052.

Figure 3:
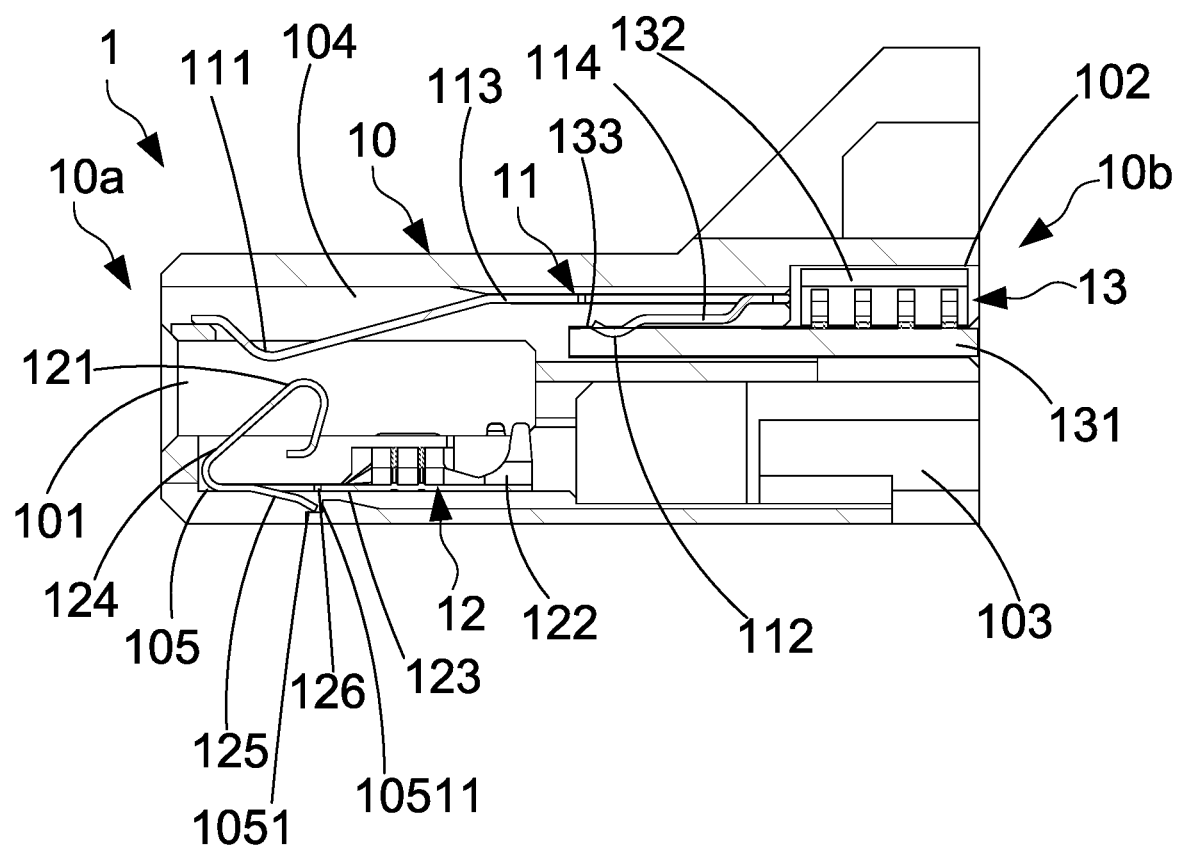
FIG. 3 is a cross-sectional view of the fan connector of the first embodiment of the present disclosure.
Figure 4:
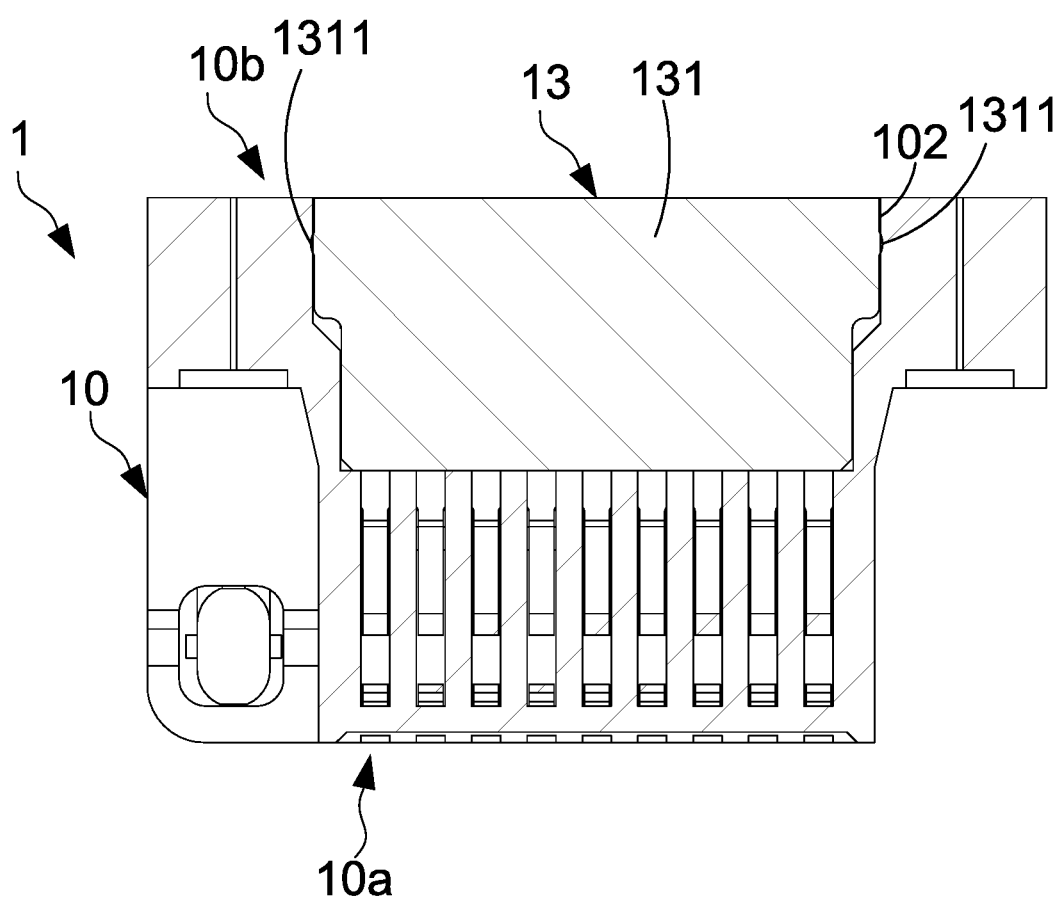
FIG. 4 is another cross-sectional view of the fan connector of the first embodiment of the present disclosure.
Figure 11:
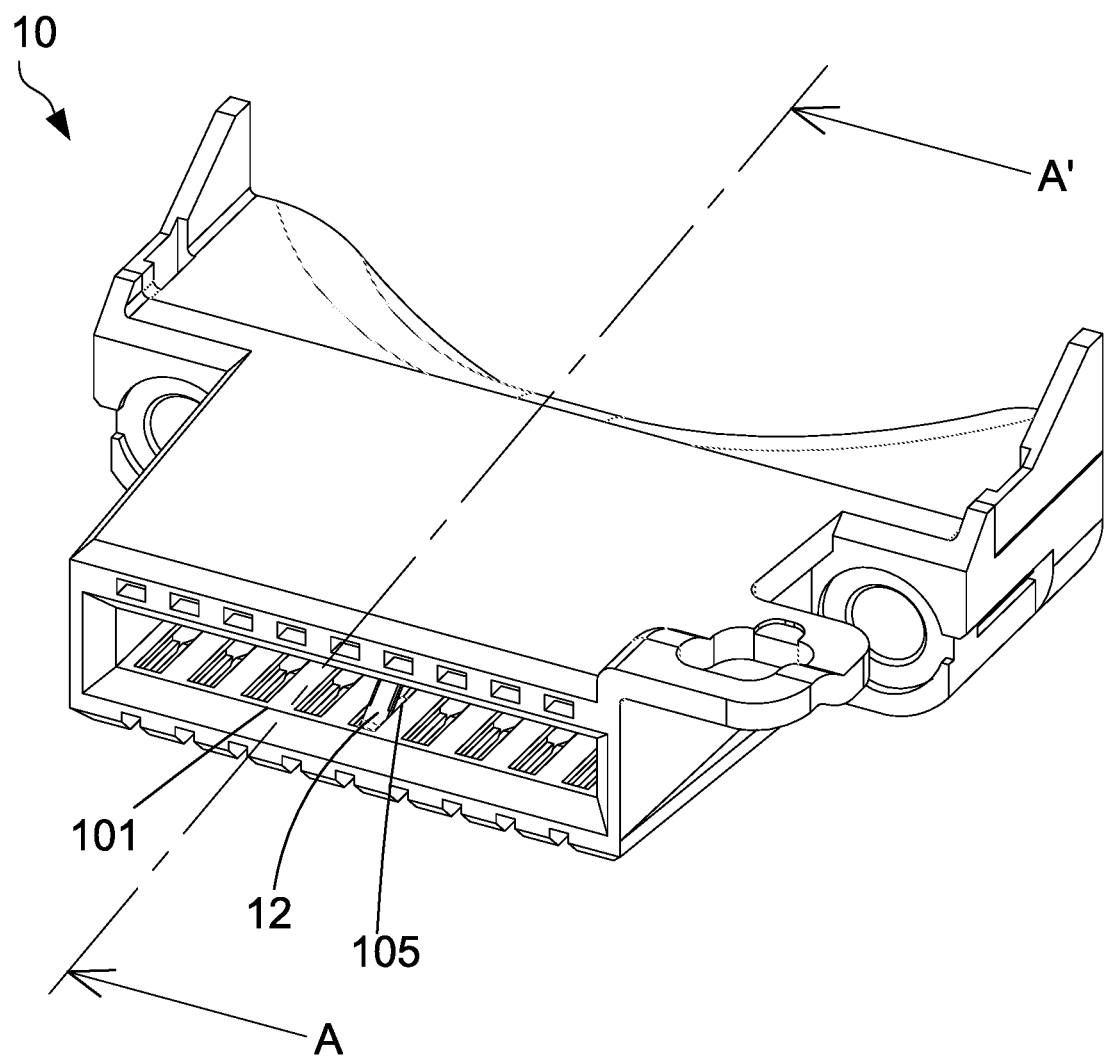
FIG. 11 is a perspective view of the wiring terminal assembled on the connector body of the second embodiment of the present disclosure.
Figure 12:
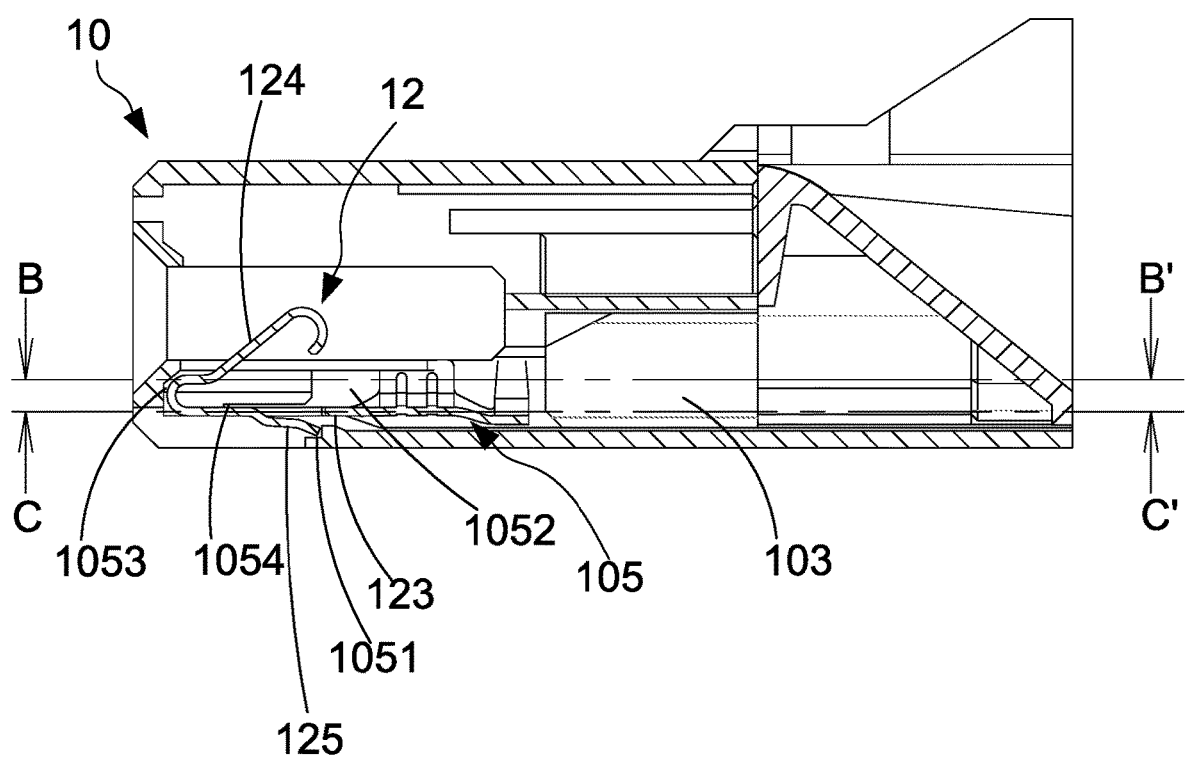
FIG. 12 is a cross-sectional view along line A-A' of FIG. 11.
Figure 13:
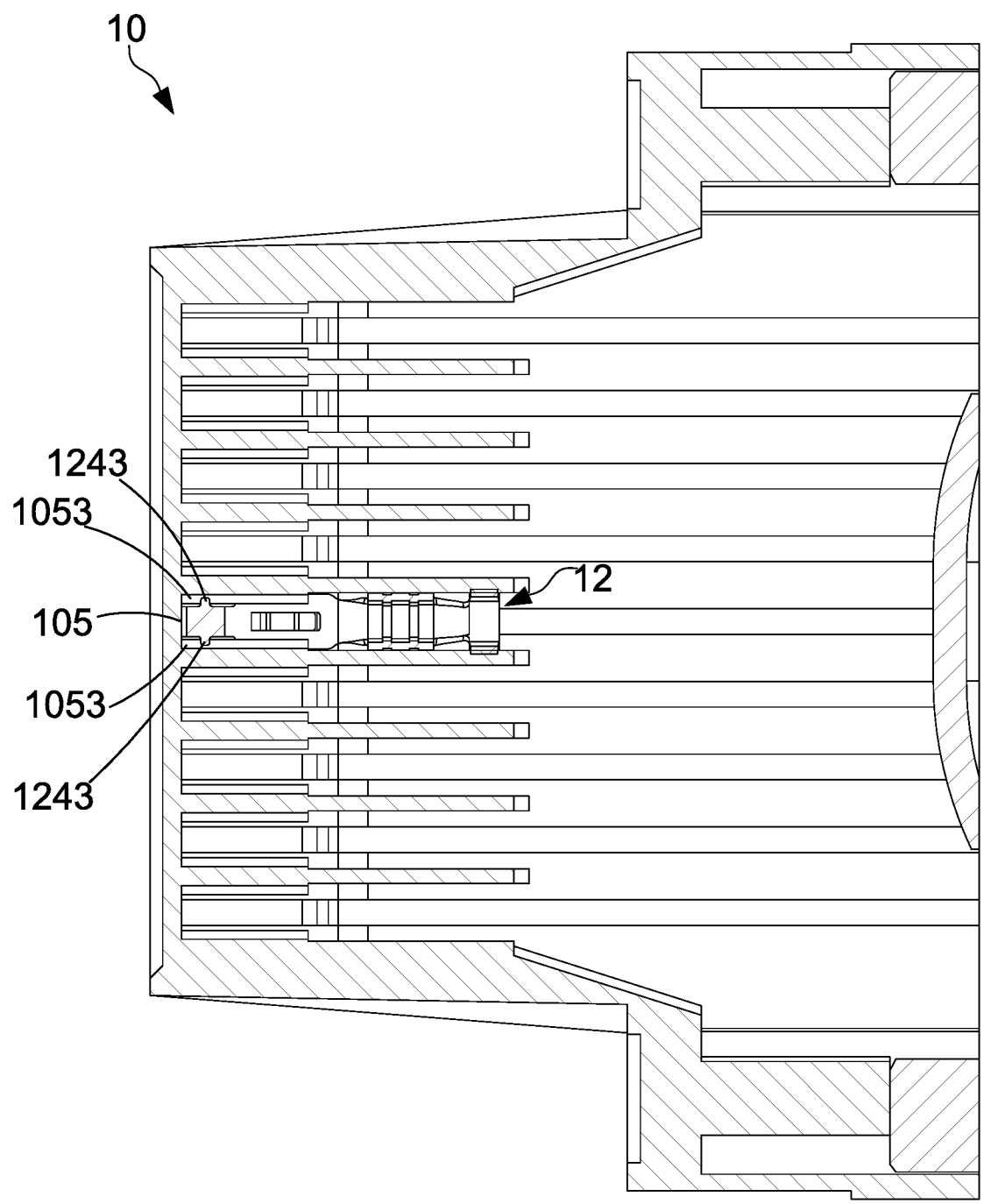
FIG. 13 is a cross-sectional view along line B-B' of FIG. 12.
Figure 14:
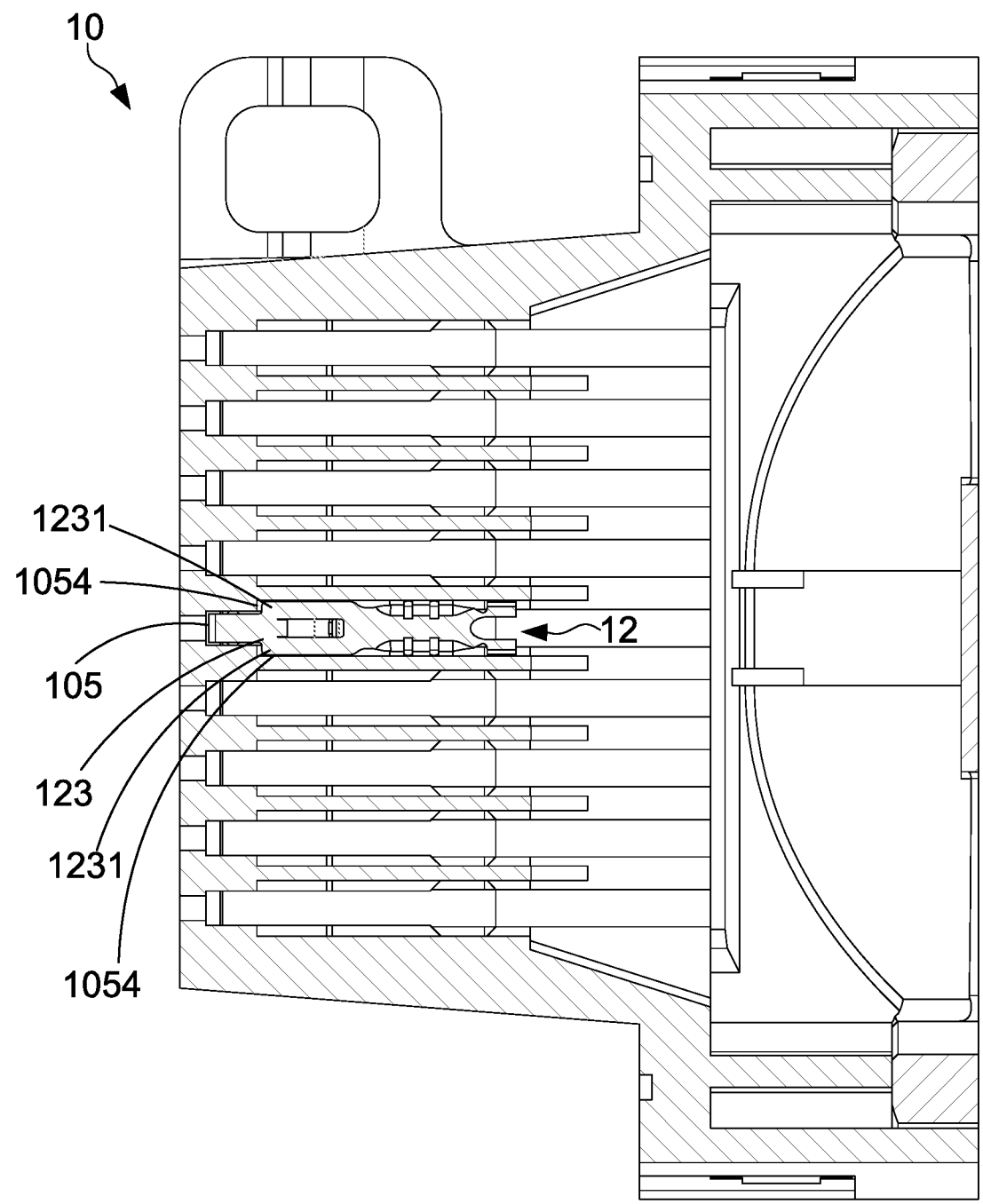
FIG. 14 is a cross-sectional view along line C-C' of FIG. 12.

FIG. 11 is a perspective view of the wiring terminal assembled on the connector body of the second embodiment of the present disclosure. FIG. 12 is a cross-sectional view along line A-A' of FIG. 11. FIG. 13 is a cross-sectional view along line B-B' of FIG. 12. FIG. 14 is a cross-sectional view along line C-C' of FIG. 12. As shown in the figures, when the wiring terminal 12 of this embodiment is assembled to the connector body 10, the wiring terminal 12 would be inserted into the wiring slot 103, and the bent spring plate 124 and the terminal body 123 of the wiring terminal 12 would respectively abut against the upper and lower sidewalls of the wiring slot 103. In other words, the upper and lower sidewalls of the wiring slot 103 could guide the wiring terminal 12 to enter. Then, the bent spring plate 124 and a part of the terminal body 123 of the wiring terminal 12 would first enter the two guiding grooves 1052 of the wiring terminal slot 105. At this time, the upper, left and right sidewalls of the guiding groove 1052 would limit the two first limiting bumps 1243 of the wiring terminal 12, allowing the wiring terminal 12 to be moving only in the wiring terminal slot 105. As the wiring terminal 12 continues to move into the wiring terminal slot 105, the two first limiting bumps 1243 would enter the two first limiting grooves 1053, then the two second limiting bumps 1231 would enter the two second limiting grooves 1054, and finally the spring buckle 125 would enter the buckling part 1051. Thus, the wiring terminal 12 can be secured in the wiring terminal slot 105. The cooperation between the first limiting bump 1243 and the first limiting groove 1053 and the cooperation between the second limiting bump 1231 and the second limiting groove 1054 could limit the deformation of the wiring terminal 12. In this way, it is possible to avoid the risk of breaking of the connecting end part 1241 due to excessive bending when an external plug 3 is incorrectly inserted into the wiring terminal 12, and also possible to avoid short circuit by preventing the contacting part 121 from touching the terminal body 123 due to excessive bending of the connecting end part 1241. In other embodiments, the first limiting bump 1243 can be omitted in the wiring terminal 12, and the guiding groove 1052 and the first limiting groove 1053 can also be omitted in the connector body 10, with only the second limiting bump 1231 provided in the wiring terminal 12 to be correspondingly inserted into the second limiting groove 1054, as shown in FIG. 3 and FIG. 8.

Figure 15:
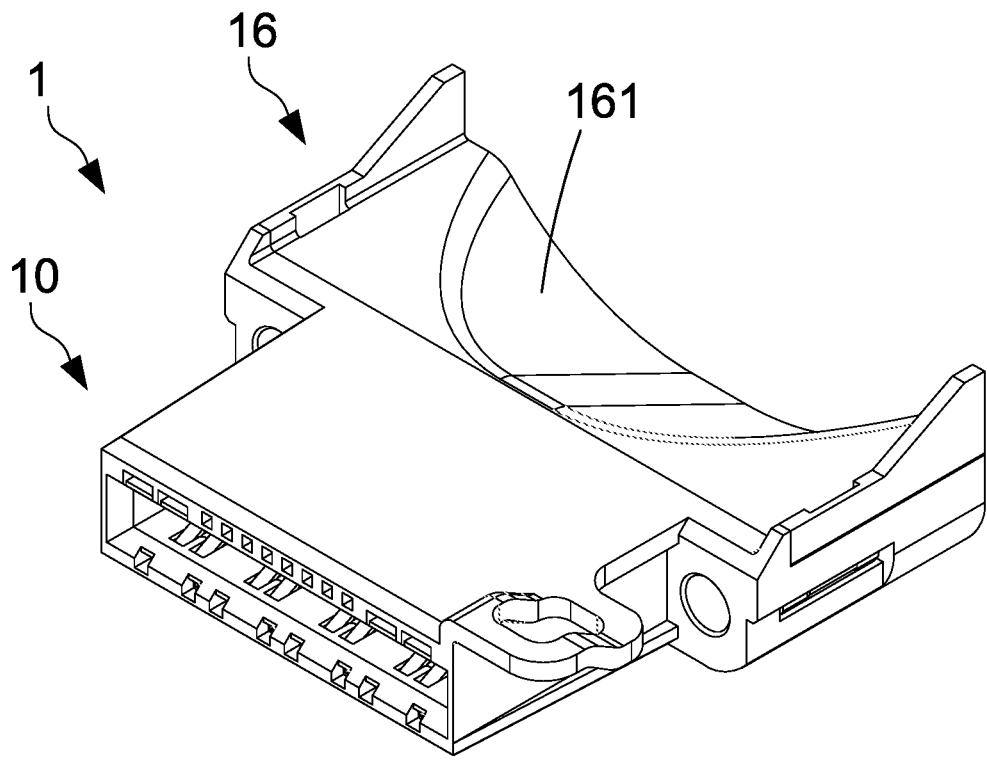
FIG. 15 is a perspective view of a fan connector of the third embodiment of the present disclosure.
Figure 16:
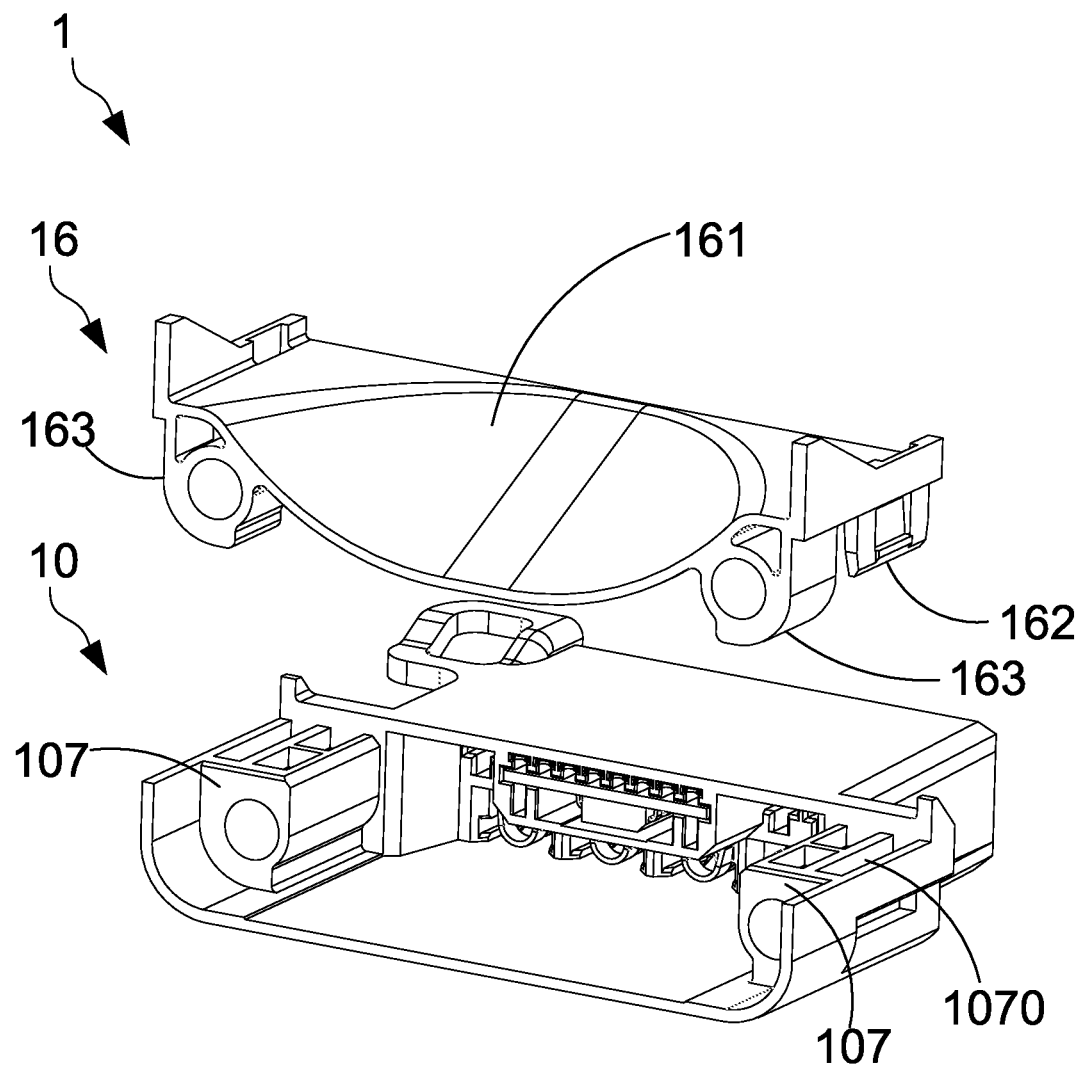
FIG. 16 is an exploded view of the fan connector of the third embodiment of the present disclosure.

FIG. 15 and FIG. 16 are perspective view and exploded view of a fan connector of the third embodiment of the present disclosure. As shown in the figure, the fan connector 1 of this embodiment is different from that of the first embodiment in that the deflector 16 of this embodiment is removably mounted to the connector body 10. Two sides of the deflector 16 are respectively provided with a buckle 162. The two locking parts 107 are respectively provided with a locking slot 1070. When the deflector 16 is disposed on the connector body 10, the two buckles 162 are inserted into the corresponding locking slots 1070. Two sides of the deflector 16 are respectively provided with a deflecting locking part 163. The two deflecting locking parts 163 respectively correspond to the two locking parts 107. The locking member passes through the corresponding locking part 107 and deflecting locking part 163 to secure the deflector 16 to the connector body 10. In this embodiment, the bottom surface of the deflecting part 161 is curved. When the fan 2 is mounted to the fan connector 1, the edge of the deflecting part 161 is disposed on the periphery of the air outlet of the fan 2, so that the air outlet can be completely exposed to prevent a part of the air outlet from being blocked by the deflector 16 for keeping the fan performance at an excellent level.

Figure 17:
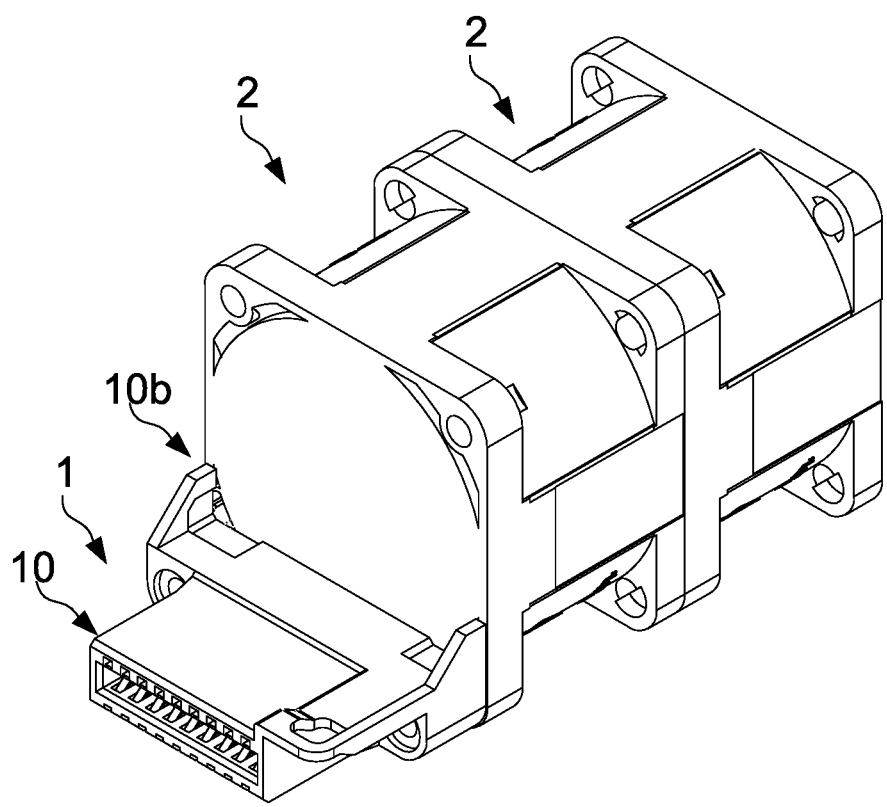
FIG. 17 is a use state diagram of a fan connector of the fourth embodiment of the present disclosure.

FIG. 17 is a use state diagram of a fan connector of the fourth embodiment of the present disclosure. As shown in the figure, the fan connector 1 of this embodiment is different from that of the first embodiment in that the fan connector 1 can be connected to a plurality of fans 2. The plurality of fans 2 is connected in a pile form and the piling of the fans 2 is secured to the second end 10b of the connector body 10. The manner in which the plurality of fans 2 is secured to the connector body 10 has been described in the first embodiment, details would not be described again herein.

Figure 18:
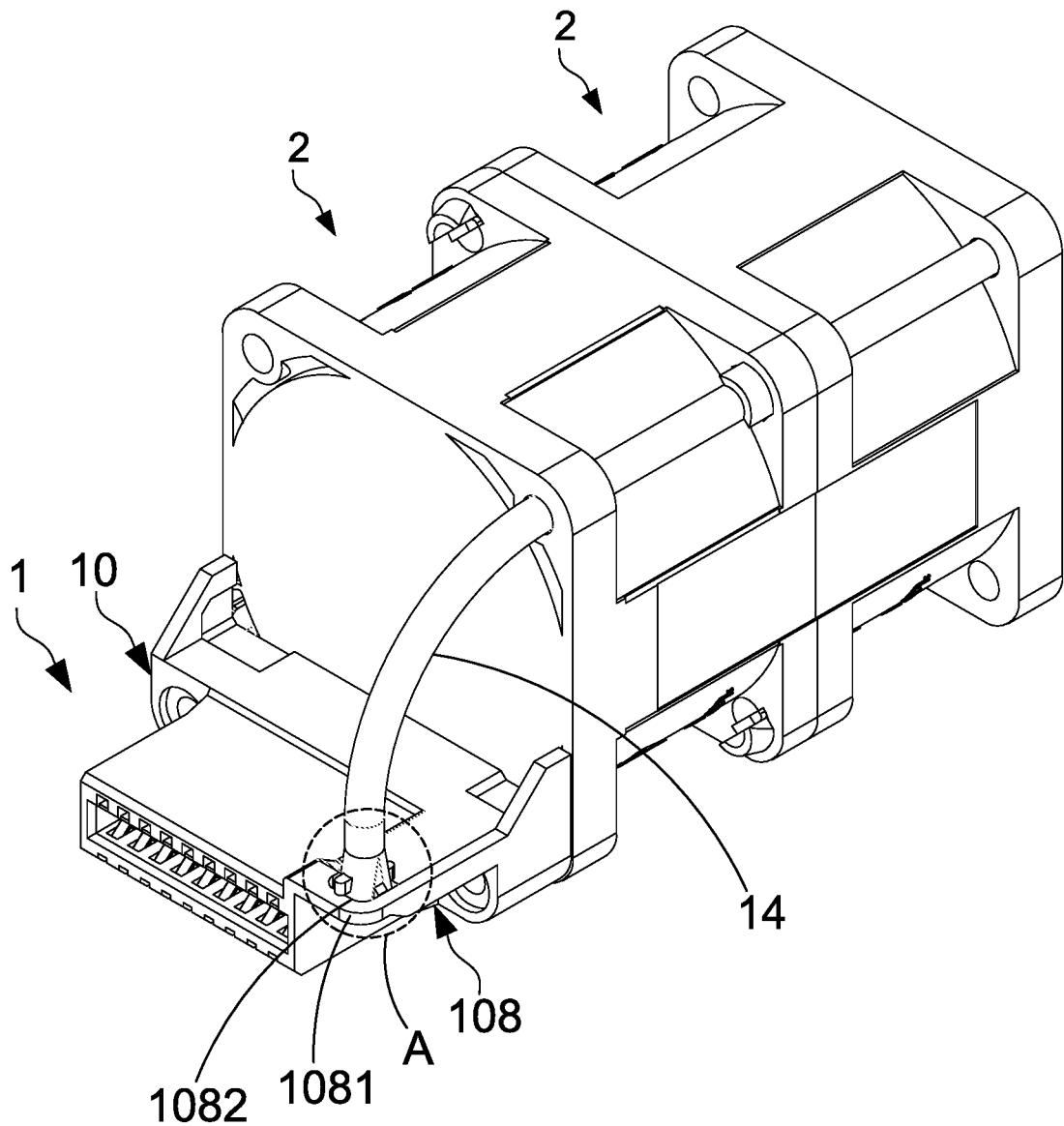
FIG. 18 is a use state diagram of a fan connector of the fifth embodiment of the present disclosure.

FIG. 18 is a use state diagram of a fan connector of the fifth embodiment of the present disclosure. The fan connector 1 of this embodiment is different from that of the third embodiment in that the fan connector 1 further comprises a light guiding cylinder 14, and the connector body 10 further comprises a light guiding cylinder mounting part 108. One end of the light guiding cylinder 14 is secured to the light guiding cylinder mounting part 108. The other end of the light guiding cylinder 14 passes through the fan 2. When a light source enters one end of the light guiding cylinder 14, the light is transmitted in the light guiding cylinder 14 and is emitted from the other end of the light guiding cylinder 14, indicating the state of use of the fan connector 1.

Figure 19:
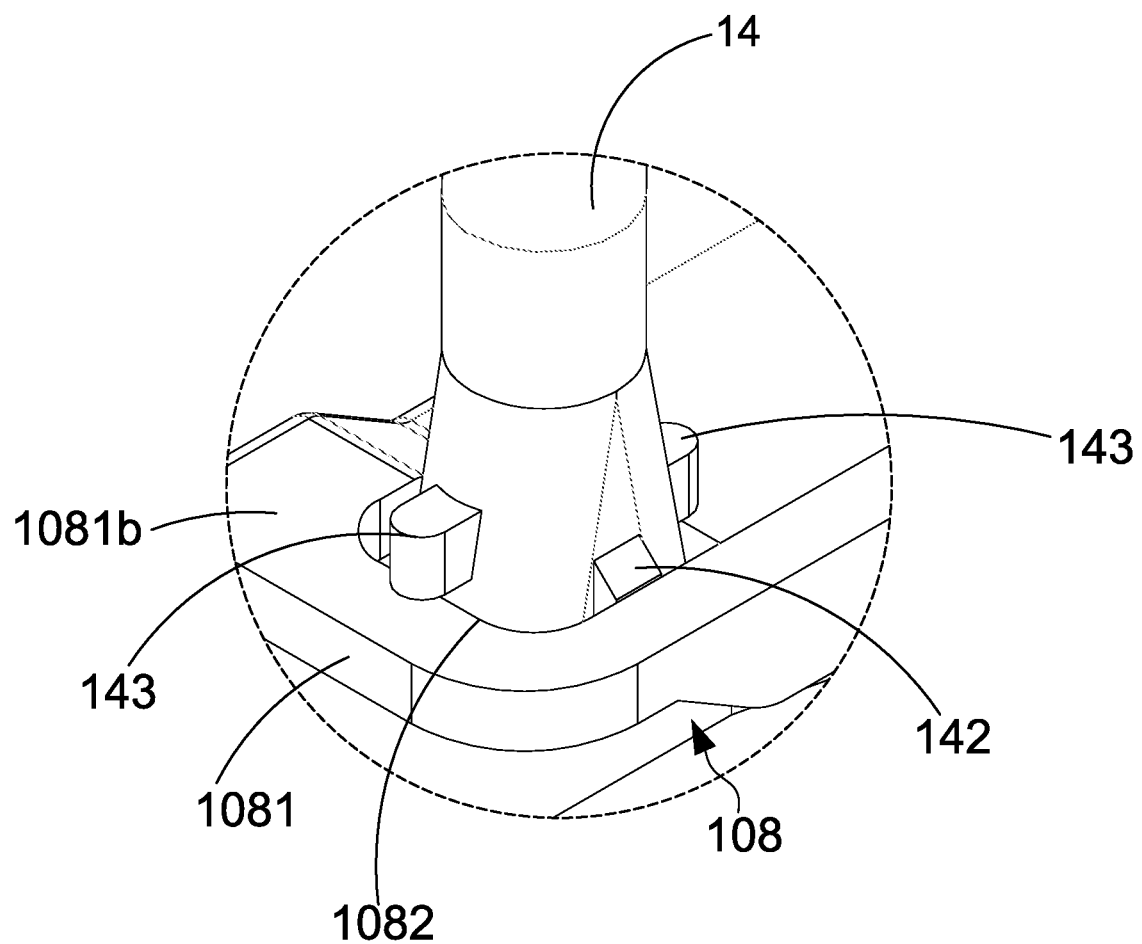
FIG. 19 is an enlarged view of area A in FIG. 18.
Figure 20:
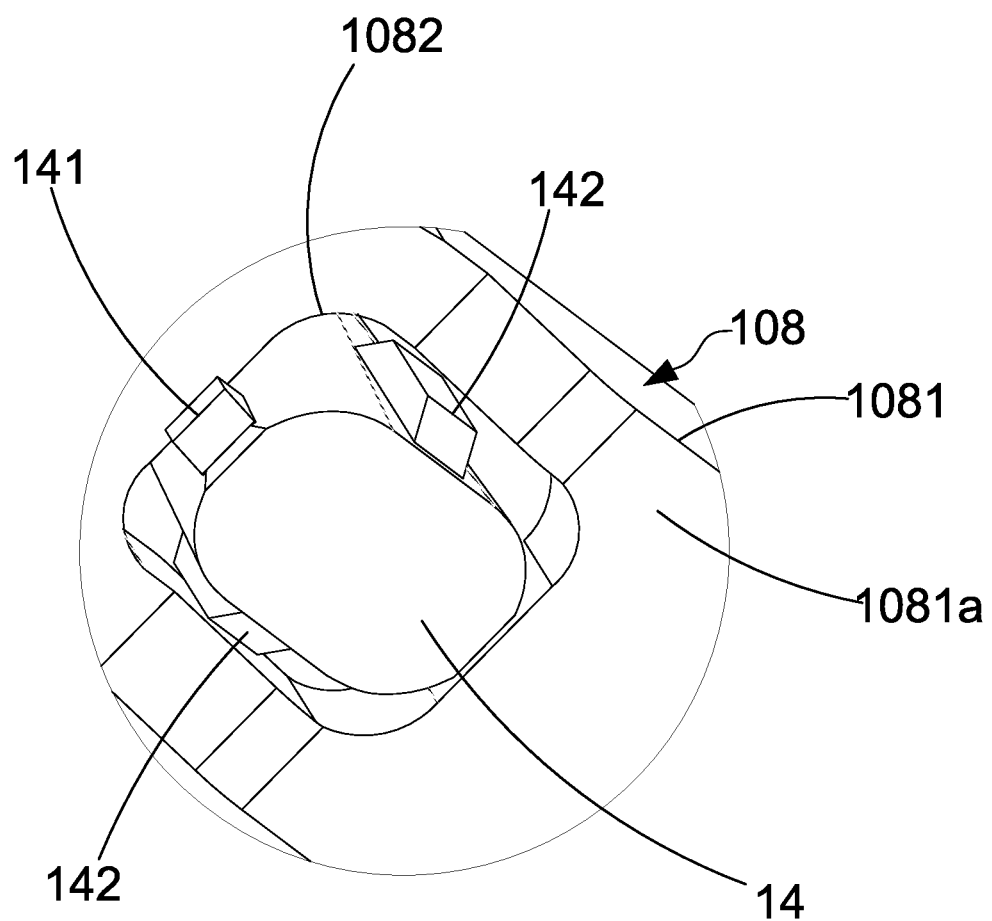
FIG. 20 is an enlarged rear view of area A in FIG. 18.

FIG. 19 is an enlarged view of area A in FIG. 18. FIG. 20 is an enlarged rear view of the area A in FIG. 18. As shown in the figures, the light guiding cylinder mounting part 108 comprises a securing plate 1081 and a light guiding cylinder mounting hole 1082. The securing plate 1081 comprises a first surface 1081a and a second surface 1081b opposite to the first surface 1081a. The light guiding cylinder mounting hole 1082 penetrates the first surface 1081a and the second surface 1081b. When the light guiding cylinder 14 is mounted to the light guiding cylinder mounting part 108, one end of the light guiding cylinder 14 passes through the light guiding cylinder mounting hole 1082. The light guiding cylinder mounting hole 1082 secures one end of the light guiding cylinder 14.

In one embodiment, a buckle 141 is provided on a sidewall of one end of the light guiding cylinder 14. When one end of the light guiding cylinder 14 passes through the light guiding cylinder mounting hole 1082, the buckle 141 also passes through the light guiding cylinder mounting hole 1082 and abuts against the first surface 1081a. In this way, one end of the light guiding cylinder 14 is secured to the light guiding cylinder mounting hole 1082, increasing the connection stability of the light guiding cylinder 14 and the light guiding cylinder mounting hole 1082.

In one embodiment, a pad block 142 is provided on the sidewall of one end of the light guiding cylinder 14. When one end of the light guiding cylinder 14 passes through the light guiding cylinder mounting hole 1082, the pad block 142 is disposed in the light guiding cylinder mounting hole 1082 and abuts against a sidewall of the light guiding cylinder mounting hole 1082. Thus, the light guiding cylinder 14 can be positioned in the light guiding cylinder mounting hole 1082. In this embodiment, the number of the pad block 142 is two, and it could be one or multiple.

In one embodiment, a stopper 143 is provided on the sidewall of one end of the light guiding cylinder 14. When one end of the light guiding cylinder 14 passes through the light guiding cylinder mounting hole 1082, the stopper 143 does not pass through the light guiding cylinder mounting hole 1082 and abuts against the second surface 1081b. Thus, the connection stability of the light guiding cylinder 14 and the light guiding cylinder mounting hole 1082 is increased. In this embodiment, the number of the stopper 143 is two, and it could be one or multiple.

Figure 21:
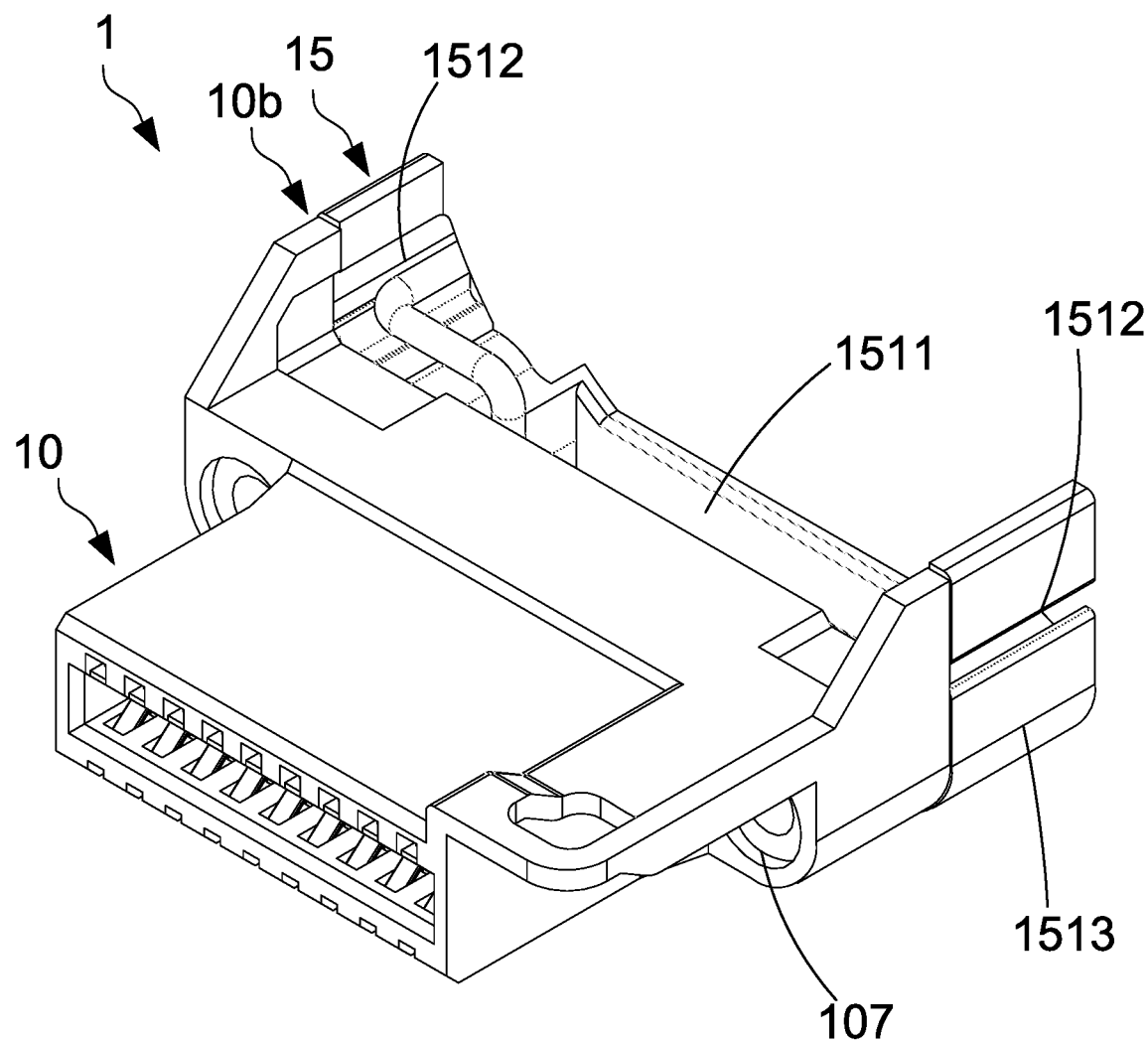
FIG. 21 is a perspective view of a fan connector of the sixth embodiment of the present disclosure.
Figure 22:
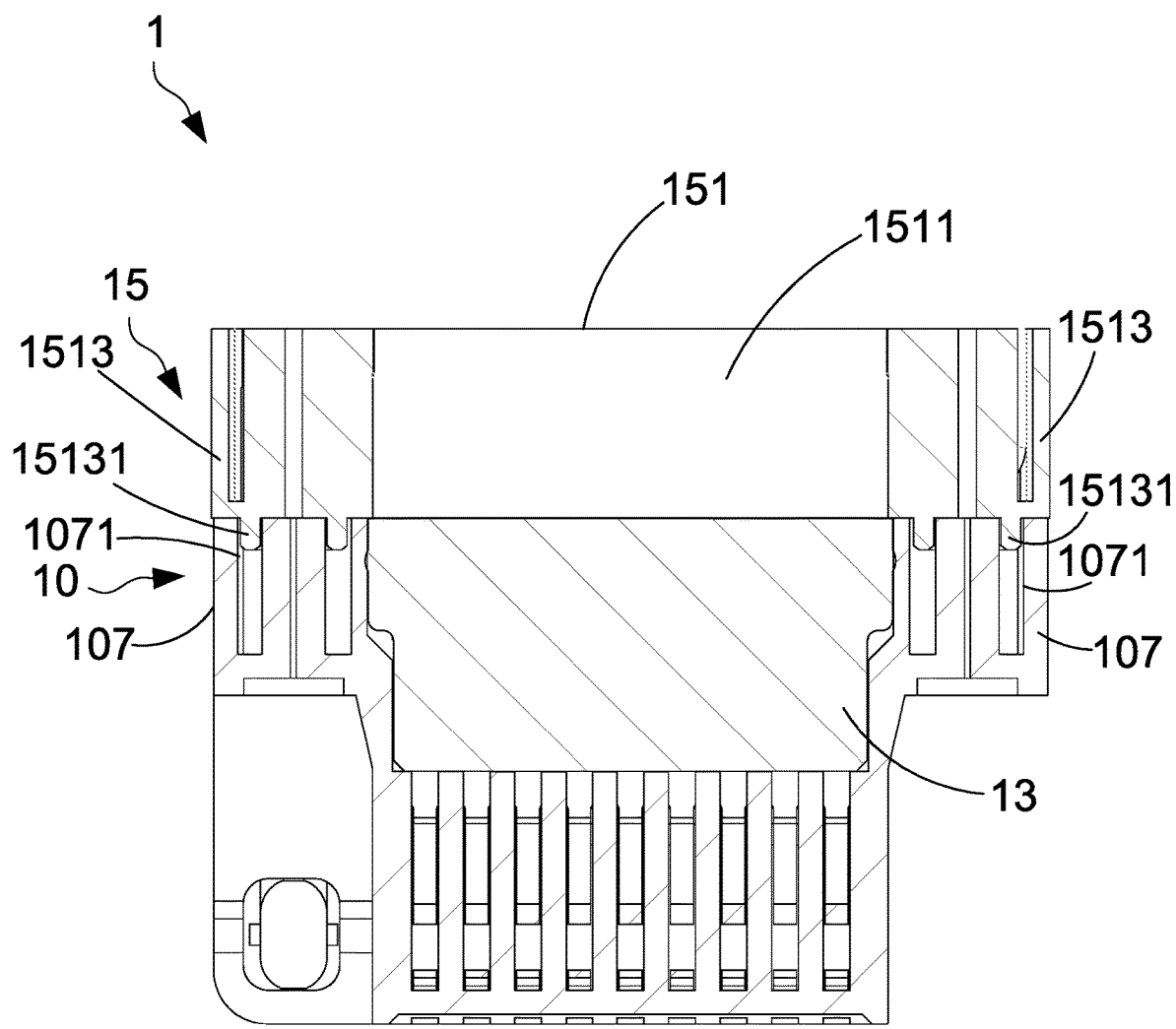
FIG. 22 is a cross-sectional view of the fan connector of the sixth embodiment of the present disclosure.
Figure 23:
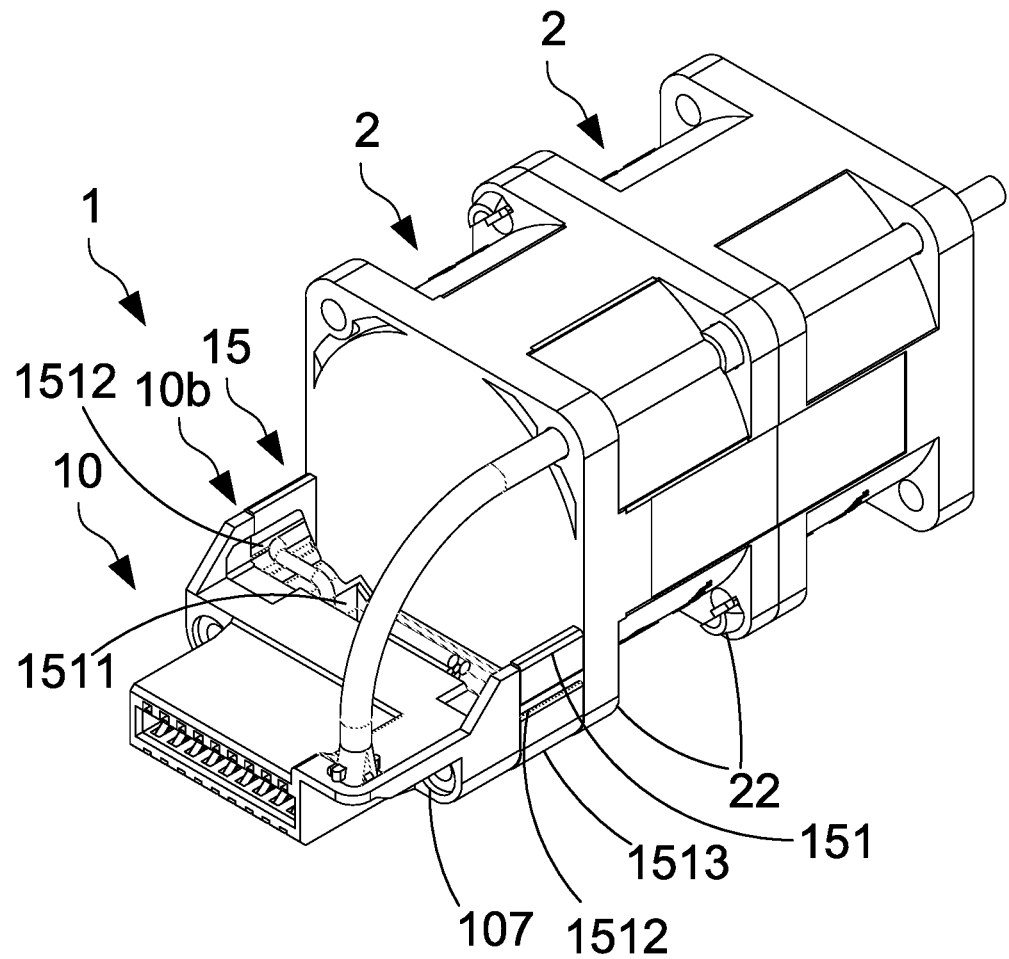
FIG. 23 is a use state diagram of the fan connector of the sixth embodiment of the present disclosure.

FIG. 21 to FIG. 23 are perspective view, cross-sectional view and use state diagram of a fan connector of the sixth embodiment of the present disclosure. As shown in the figures, the fan connector 1 of this embodiment is different from that of the fifth embodiment in that the fan connector 1 further comprises a shielding 15 disposed at the second end 10b of the connector body. The shielding 15 corresponds to the chip circuit board 13. The shielding 15 could prevent the chip circuit board 13 from disengaging from the chip slot 102 of the connector body 10. In this embodiment, when the fan connector 1 is in use, the fan 2 is mounted to one side of the shielding 15 away from the connector body 10. It indicates that the shielding 15 is disposed between the connector body 10 and the fan 2. The shielding 15 is connected to the connector body 10 through the locking part 107.

In this embodiment, the shielding 15 further comprises an anti-disengaging part 151 disposed at the second end 10b of the connector body 10. The anti-disengaging part 151 corresponds to the chip circuit board 13. In particular, the anti-disengaging part 151 abuts against the chip circuit board 13 in facing to the surface of the chip circuit board 13 to prevent the chip circuit board 13 from disengaging from the chip slot 102 of the connector body 10. In one embodiment, the anti-disengaging part 151 further comprises wire accommodating slot 1511 communicating with the wiring slot 103. The wiring between the wiring terminals 12 and the fan 2 passes through the wire accommodating slot 1511. The surfaces of the anti-disengaging part 151 on two sides of the wire accommodating slot 1511 abut against the chip circuit board 13. In one embodiment, two sides of the anti-disengaging part 151 are respectively provided with a wiring hole 1512, allowing the wire to pass through the wiring hole 1512 from the wire accommodating slot 1511 to connect with the fan 2. Meanwhile, the wiring hole 1512 could guide the wire away from the airflow path to prevent the operation of fan 2 from being affected.

The anti-disengaging part 151 comprises a positioning part 1513. When the shielding 15 and the fan 2 are mounted to the second end 10b of the connector body 10 in order, the positioning part 1513 of the anti-disengaging part 151 is connected to the locking part 107 of the connector body 10 and corresponds to the securing part 22 of the fan 2. The locking member passes through the locking part 107 of the connector body 10, the positioning part 1513 of the anti-disengaging part 151, and the fixing part 22 of the fan 2 to secure the connector body 10, the shielding 15 and the fan 2.

In one embodiment, locking part 107 comprises a positioning recess 1071. The positioning part 1513 comprises a positioning protrusion 15131. When the locking part 107 connects to the positioning part 1513, the positioning protrusion 15131 is disposed in the positioning recess 1071 to position the shielding 15 onto the connector body 10 in advance. In this way, the shielding 15 could be prevented from being offset during the assembly process with the fan 2, and the connection stability of the shielding 15 and the connector body 10 could also be increased. The positioning recess 1071 of the locking part 107 can be replaced with the positioning protrusion, and the positioning protrusion 15131 of the positioning part 1513 can also be replaced with the positioning recess for the same effects as described above.

Figure 24:
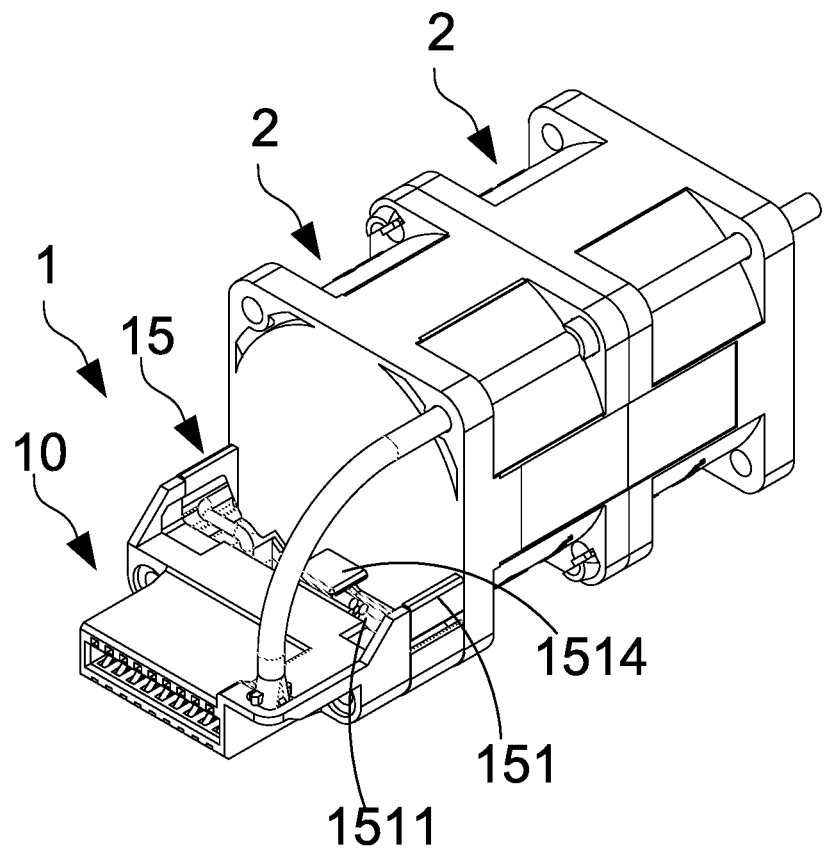
FIG. 24 is a perspective view of a fan connector of the seventh embodiment of the present disclosure.

FIG. 24 is a perspective view of a fan connector of the seventh embodiment of the present disclosure. As shown in the figure, the fan connector 1 of this embodiment is different from that of the sixth embodiment in that the anti-disengaging part 151 further comprises a wiring securing block 1514. The wiring securing block 1514 is disposed above the wire accommodating slot 1511. The wire between the wiring terminals and the fan passes through the wire accommodating slot 1511, in which the wire is secured by the wiring securing block 1514. In this way, it is possible to prevent the wire from detaching from the wire accommodating slot 1511 to keep the operation of fan 2 from being affected. The surfaces of two sides of the wire accommodating slot 1511 abut against the surface of the chip circuit board facing the shielding 15 to prevent the chip circuit board from disengaging from the chip slot.

In this embodiment, as the length of a side of the wiring securing block 1514 parallel to the connector body 10 is shorter than the length of a side of the wire accommodating slot 1511 parallel to the connector body 10, there is enough space on the two sides of the wiring securing block 1514 for the wire to pass through.

Figure 25:
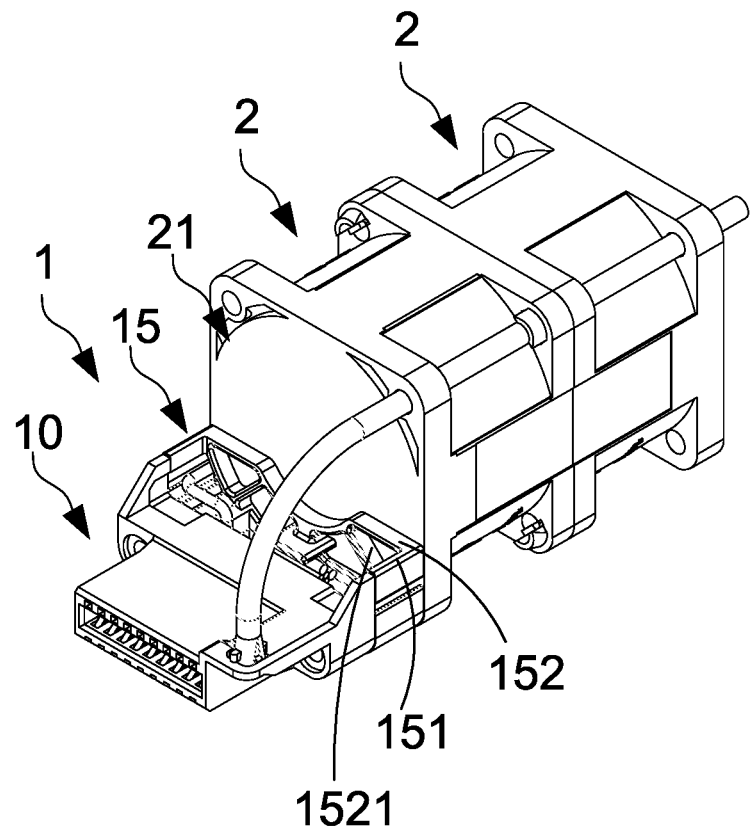
FIG. 25 is a use state diagram of a fan connector of the eighth embodiment of the present disclosure.

FIG. 25 is a use state diagram of a fan connector of the eighth embodiment of the present disclosure. As shown in the figure, the fan connector 1 of this embodiment is different from that of the seventh embodiment in that the shielding 15 further comprises a protection part 152 disposed on one side of the anti-disengaging part 151 away from the connector body 10. The protection part 152 comprises a plurality of ventilation holes 1521 corresponding to an air outlet 21 of the fan 2, allowing the airflow from the air outlet 21 of the fan 2 to flow through the plurality of ventilation holes 1521 to keep the fan 2 under regular operation. The tallness of the protection part 152 is 0.3 to 1 times the tallness of the fan 2. In this embodiment, the protection part 152 is shorter than the fan 2, and the tallness of the protection part 152 is 0.4 times the tallness of the fan 2, so the protection part 152 does not completely cover the air outlet 21 of the fan 2. The protection part 152 of this embodiment could prevent external objects such as insects and wires interfering with the operation form entering the fan 2. The protection part 152 is integrally formed with the anti-disengaging part 151 to one piece.

Figure 26:
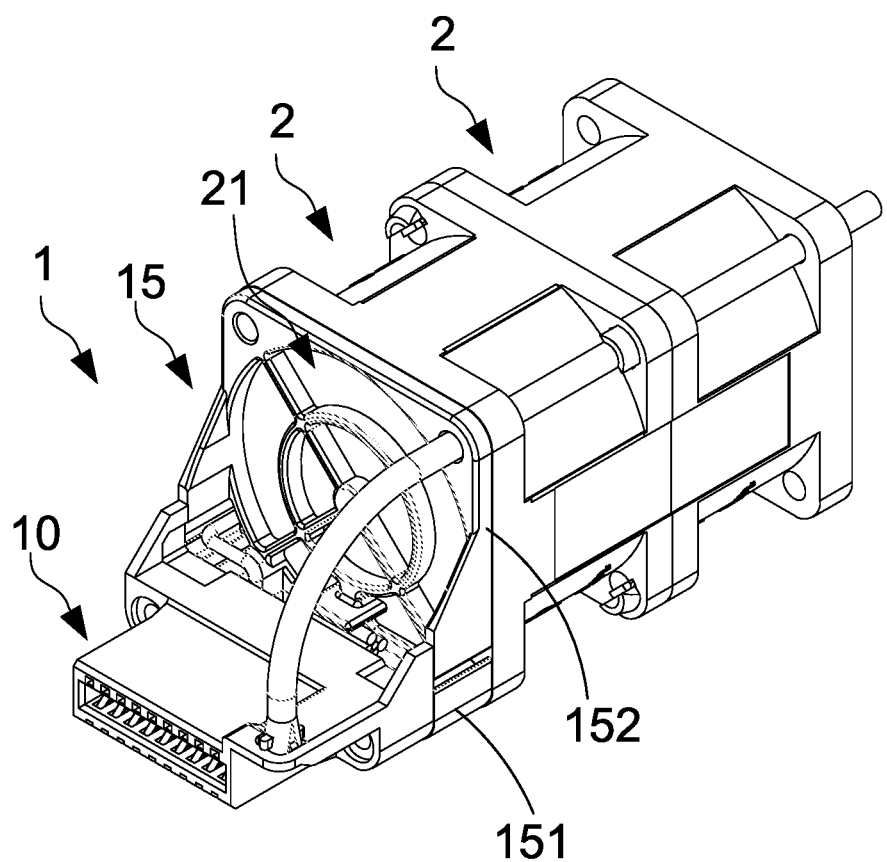
FIG. 26 is a use state diagram of a fan connector of the ninth embodiment of the present disclosure.

FIG. 26 is a use state diagram of a fan connector of the ninth embodiment of the present disclosure. As shown in the figure, the fan connector 1 of this embodiment is different from that of the eighth embodiment in that the protection part 152 is as tall as the fan 2. So that the protection part 152 could entirely cover the air outlet 21 of the fan 2, and could keep user's hands from touching fan blades for safety.

In summary, the present disclosure proposed a fan connector in which a chip is soldered onto the circuit board as a chip circuit board, which is directly inserted into the chip slot of the connector body when the fan connector is in use. The chip circuit board is easy to be inserted into the connector body, and the connective pads of the chip circuit board can be stably connected to the corresponding chip terminals, thereby the reliability of the fan connector is increased. Also, the shielding prevents the chip circuit board from disengaging from the chip slot, which also improves the reliability of the fan connector. The shielding comprises a protection part, which prevents external objects such as insects and wires from entering the fan and keep user's hands from accidentally touching fan blades.

It is to be understood that the term "comprises", "comprising", or any other variants thereof, is intended to encompass a non-exclusive inclusion, such that a process, method, article, or device of a series of elements not only include those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A fan connector, comprising:
a connector body comprising an electrical connection slot, a chip slot, and a wiring slot; the electrical connection slot is disposed at one end of the connector body; the chip slot and the wiring slot are disposed at the other end of the connector body; the electrical connection slot communicates with the chip slot and the wiring slot, respectively;
a plurality of chip terminals disposed on a sidewall of the electrical connection slot; one end of each of the plurality of chip terminals away from the electrical connection slot is disposed in the chip slot;
a plurality of wiring terminals disposed on the sidewall of the electrical connection slot; the plurality of wiring terminals corresponds to the plurality of chip terminals; one end of each of the plurality of wiring terminals away from the electrical connection slot is disposed in the connection slot; and
a chip circuit board comprising a circuit board, a chip, and a plurality of conductive pads; the chip and the plurality of conductive pads are disposed on the circuit board; the chip comprises a plurality of pins respectively connected to the corresponding plurality of conductive pads; the chip is inserted into the chip slot; the plurality of conductive pads is in contact with the corresponding plurality of chip terminals, respectively;
wherein the other end of the connector body is connected to the fan; a wire of the fan passes through the wiring slot and connects to the plurality of wiring terminals; an external plug is possible to insert into the electrical connection slot; the plurality of chip terminals and the plurality of connection terminals are in contact with a plurality of conductive terminals of the external plug, respectively;
wherein each of the wiring terminals comprises a terminal body and a bent spring plate; one end of the bent spring plate is connected to the terminal body; two sides of the bent spring plate are respectively provided with a first limiting bump; two sides of the terminal body are respectively provided with a second limiting bump; two sidewalls of the wiring terminal slots are respectively provided with a guiding groove, a first limiting groove and a second limiting groove; the first limiting groove and the second limiting groove are respectively disposed in an upper and lower arrangement; the guiding groove is disposed at one ends of the first limiting groove and the second limiting groove; the first limiting groove and the second limiting groove are farther than the guiding groove from the wiring slot, and are communicating with the guiding groove; a sidewall of the guiding groove guides the first limiting bump into the corresponding first limiting groove; a sidewall of the guiding groove guides the second limiting bump into the corresponding second limiting groove.

2. The fan connector according to claim 1, wherein the bent spring plate comprises a connecting end part and a contacting end part; the connecting end part comprises a bent section and a flat section; the bent section is connected to the terminal body; the flat section is connected to the contacting end part; the flat section is parallel to the terminal body; two sides of the flat section are respectively provided with the first limiting bump.

3. The fan connector according to claim 1 further comprising a shielding disposed at the other end of the connector body; the shielding corresponds to the chip circuit board; the shielding is disposed between the connector body and the fan.

4. The fan connector according to claim 3, wherein the connector body further comprises a locking part disposed on one side of the connector body; the shielding is connected to the connector body through the locking part.

5. The fan connector according to claim 4, wherein the shielding comprises an anti-disengaging part comprising a positioning part connected to the locking part; the positioning part blocks the chip circuit board.

6. The fan connector according to claim 5, wherein the locking part comprises a positioning recess; the positioning part comprises a positioning protrusion; the positioning protrusion is disposed in the positioning recess.

7. The fan connector according to claim 5, wherein the anti-disengaging part comprises a wire accommodating slot communicating with the wiring slot; the wire passes through the wire accommodating slot.

8. The fan connector according to claim 7, wherein the anti-disengaging part further comprises a wiring securing block disposed above the wire accommodating slot; the wiring securing block secures the wire in the wire accommodating slot.

9. The fan connector according to claim 7, wherein the shielding further comprises a protection part disposed on one side of the anti-disengaging part away from the connector body; the protection part comprises a plurality of ventilation holes corresponding to an air outlet of the fan.

10. The fan connector according to claim 9, wherein the tallness of the protection part is 0.3 to 1 times the tallness of the fan.

11. The fan connector according to claim 9, wherein the protection part further comprises a wiring hole communicating with the wire accommodating slot.

12. The fan connector according to claim 1 further comprising a light guiding cylinder; the connector body comprises a light guiding cylinder mounting part; one end of the light guiding cylinder is secured to the light guiding cylinder mounting part.

13. The fan connector according to claim 12, wherein the light guiding cylinder mounting part comprises a securing plate and a light guiding cylinder mounting hole; the securing plate comprises a first surface and a second surface opposite to the first surface; the light guiding cylinder mounting hole penetrates the first surface and the second surface; the light guiding cylinder mounting hole secures one end of the light guiding cylinder.

14. The fan connector according to claim 13, wherein a buckle is provided on a sidewall of one end of the light guiding cylinder; one end of the light guiding cylinder passes through the light guiding cylinder mounting hole; the buckle abuts against the first surface.

15. The fan connector according to claim 14, wherein a pad block is provided on the sidewall of one end of the light guiding cylinder; the pad block abuts against a sidewall of the light guiding cylinder mounting hole.

16. The fan connector according to claim 15, wherein a stopper is provided on the sidewall of one end of the light guiding cylinder; the stopper abuts against the second surface.

17. The fan connector according to claim 1 further comprising a deflector disposed on the second end of the connector body; the deflector comprises a deflecting part corresponding to the air outlet of the fan.

18. The fan connector according to claim 17, wherein the bottom surface of the deflecting part is flat or curved.

19. The fan connector according to claim 17, wherein the deflector is integrally formed with the connector body to one piece.

* * * * *